US011437963B2

(12) United States Patent
Manganaro et al.

(10) Patent No.: US 11,437,963 B2
(45) Date of Patent: Sep. 6, 2022

(54) AMPLIFIERS FOR RF ADCS

(71) Applicant: Analog Devices International Unlimited Company, Limerick (IE)

(72) Inventors: Gabriele Manganaro, Winchester, MA (US); Athanasios Ramkaj, Leuven (BE); Filip Tavernier, Oud-Heverlee (BE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/031,426

(22) Filed: Sep. 24, 2020

(65) Prior Publication Data
US 2022/0094317 A1 Mar. 24, 2022

(51) Int. Cl.
*H03F 3/45* (2006.01)
*H03F 3/195* (2006.01)

(52) U.S. Cl.
CPC ......... *H03F 3/45219* (2013.01); *H03F 3/195* (2013.01); *H03F 2200/432* (2013.01); *H03F 2200/451* (2013.01); *H03F 2200/54* (2013.01); *H03F 2203/45306* (2013.01)

(58) Field of Classification Search
CPC ........................................................ H03F 3/45
USPC .................................................. 330/253, 311
See application file for complete search history.

(56) References Cited

U.S. PATENT DOCUMENTS

| 4,888,503 | A  | * | 12/1989 | Young   | G11C 7/062  |
|-----------|----|---|---------|---------|-------------|
|           |    |   |         |         | 327/52      |
| 6,417,737 | B1 | * | 7/2002  | Moloudi | H03B 21/01  |
|           |    |   |         |         | 330/301     |
| 7,801,504 | B2 |   | 9/2010  | Wu      |             |
| 7,902,923 | B2 |   | 3/2011  | Li et al. |           |
| 8,577,325 | B2 |   | 11/2013 | Lee et al. |          |
| 10,079,582| B2 | * | 9/2018  | Gathman | H03F 1/42   |

OTHER PUBLICATIONS

Shim et al., *A band-selective low-noise amplifier using an improved tunable active inductor for 3-5 GHz UWB receivers*, Microelectronics Journal 65 (2017) 6 pages.
Vaz et al., *A 13b 4GS/s Digitally Assisted Dynamic 3-Stage Asynchronous Pipelined-SAR ADC*, ISSCC 2017, Session 16, Gigahertz Data Converters, 16.1, 3 pages.
Wang et al., *A Power Reduction Technique for Wideband Common Gate Low Noise Amplifiers*, 978-1-4799-4132-2/14 © 2014 IEEE, 4 pages.

(Continued)

*Primary Examiner* — Henry Choe
(74) *Attorney, Agent, or Firm* — Patent Capital Group

(57) ABSTRACT

High-performance radio frequency analog-to-digital converters (RF ADCs) demand high bandwidth, high linearity, and low noise input amplifiers. A Class-AB amplifier, including common-gate transistor devices and common-source transistor devices operating in parallel, offers high bandwidth and high linearity, while offering lower power operation when compared to Class-A amplifiers. The Class-AB amplifier can be followed by a Class-AB unity gain buffer comprising common-source transistor devices to provide additional isolation for the RF ADC from the circuitry preceding the Class-AB amplifier.

33 Claims, 7 Drawing Sheets

(56) References Cited

OTHER PUBLICATIONS

Vaz et al., *A 13bit 5GS/s ADC with time-interleaved chopping calibration in 16nm FinFET*, 978-1-5386-4214-6/18 © 2018 IEEE, 2 pages.
Staayer et al., *A 4GS/s Time-Interleaved RF ADC in 65nm CMOS with 4GHz Input Bandwidth*, ISSCC 2016, Session 27, Hybrid and Nyquist Data Converters, 27.5, 3 pages.
Devarajan et al., *A 12-b 10-GS/s Interleaved Pipeline ADC in 28-nm CMOS Technology*, IEEE Journal of Solid-State Circuits, vol. 52, No. 12, Dec. 2017, 15 pages.
Chen et al., *A 1.2 V 490μW Sub GHz UWB CMOS LNA with Current Reuse Negative Feedback*, 978-1-5386-4881-0/18 © 2018 IEEE, 4 pages.
Ramkaj et al., *A 5GS/s 158.6mW 12b Passive-Sampling 8x-Interleaved Hybrid ADC with 9.4 ENOB and 160.5dB FoMs in 28nm CMOS*, ISSCC 2019, Session 3, Nyquist Rate ADCs, 3.3, 3 pages.
Khalili et al., *A capacitor Cross-Coupled Differential Cascode Low-Noise Amplifier*, IEEE-ICEDSA2012 Proc., 2012, Kuala Lumpur, Malaysia, 6 pages.
Fan et al., *A Noise Reduction and Linearity Improvement Technique for a Differential Cascode LNA*, IEEE Journal of Solid-State Circuits, vol. 43, No. 3, Mar. 2008, 12 pages.
Khurram et al., *A 3-5 GHz Current-Reuse gm-Boosted CG LNA for Ultrawideband iin 130 nm CMOS*, IEEE Transactions on Very Large Scale Integration (VLSI) Systems, vol. 20, No. 3, Mar. 2012, 10 pages.
Lee et al., *Low-power UWB LNA with common-gate and current-reuse technigues*, IET Microwaves, Antennas & Propagation, Sep. 2, 2011, www.ietdl.org, 7 pages.
Rakuljic et al., *In-situ nonlinear calibration of a RF signal chain*, 978-1-5386-4881-0/18 © 2018 IEEE, 5 pages.
Cai et al., *Design of Common Gate UWB LNA in CMOS*, 978-1-4244-3870-9/09 © 2009 IEEE, 4 pages.
Ali et al., *A 14b 1GS/s RF Sampling Pipeline ADC with Background Calibration*, ISSCC 2014, Session 29, Data Converters for Wireless Systems, 29.3, 3 pages.
Ali et al., *A 14-bit 2.5GS/s and 5GS/s RF Sampling ADC with Background Calibration and Dither*, 978-1-5090-0635-9/16 © 2016 IEEE, 2 pages.
Zhuo et al., *A capacitor cross-coupled common-gate low-noise amplifier*, Eindhoven University of Technology, Jan. 1, 2005, 6 pages.
Wu et al., *A 4GS/s 13b Pipelined ADC with Capacitor and Amplifier Sharing in 16nm CMOS*, ISSCC 2016, Session 27, Hybrid and Nyquist Data Converters, 27.6, 3 pages.
Weng et al., *A Low-Power Full-Band Low-Noise Amplifier for Ultra-Wideband Receivers*, IEEE Transactions on Microwave Theory and Techniques, vol. 58, No. 8, Aug. 2010, 7 pages.

* cited by examiner

AMPLIFIERS FOR RF ADCS

TECHNICAL FIELD OF THE DISCLOSURE

The present disclosure relates generally to amplifiers, more particularly but not limited to, hybrid amplifiers for radio frequency (RF) analog-to-digital converters (ADCs).

BACKGROUND

In many electronics applications, an analog input signal is converted to a digital output signal (e.g., for further digital signal processing). For instance, an antenna generates an analog signal based on the electromagnetic waves carrying information/signals in the air. The analog signal generated by the antenna is then provided as input to an ADC to generate a digital output signal for further processing.

ADCs convert a continuous physical quantity that is also known as an analog signal to a digital signal whose values represent the quantity's amplitude (or to a digital signal carrying that digital number). One critical limitation to the performance of an ADC is the linearity of the overall system, or the linearity of the receiver signal chain. Linearity can, for example, affect the signal-to-noise-and-distortion ratio (SI-NAD) and spurious free dynamic range (SFDR). In some cases, circuit designers achieve better linearity at the cost of implementing more complex and/or power hungry circuit designs, especially for the circuits which drive the ADC.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

High-performance RF ADCs demand high bandwidth, high linearity, and low noise input amplifiers. A Class-AB amplifier, including common-gate transistor devices and common-source transistor devices operating in parallel, offers high bandwidth and high linearity, while offering lower power operation when compared to Class-A amplifiers. The Class-AB amplifier can be followed by a Class-AB unity gain buffer comprising common-source transistor devices to provide additional isolation for the RF ADC from the circuitry preceding the Class-AB amplifier.

Design Considerations for Input Circuitry Driving ADCs

Figure 1:
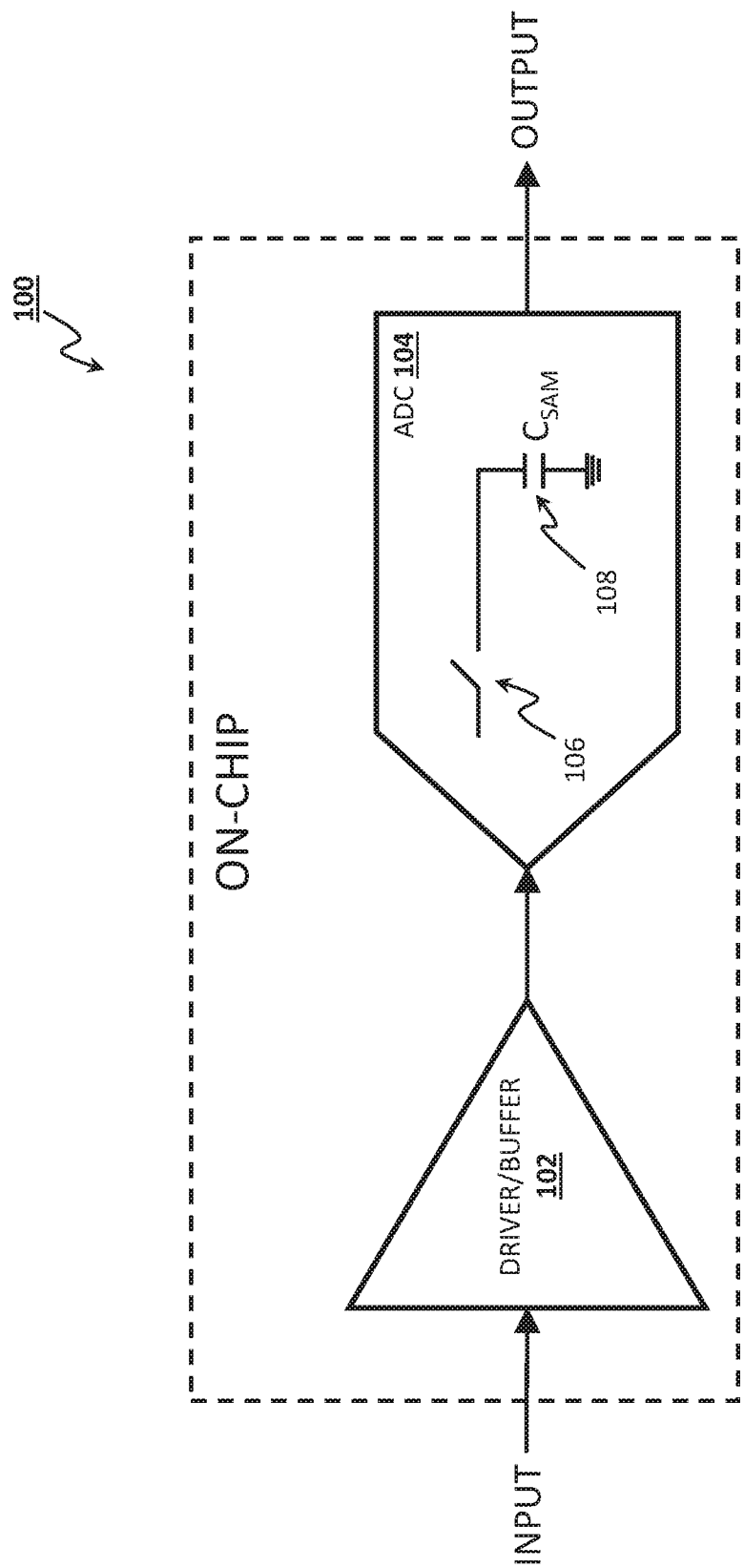
FIG. 1 shows a driver or buffer in front of an ADC, according to some embodiments of the disclosure.

A receiver signal chain for receiving and processing analog signals typically has a contiguous chain of function blocks (the ADC being one of the function blocks). For instance, receiver signal chain can include a mixer, input circuitry (such as a driving amplifier), a filter (e.g., anti-aliasing filter), and an ADC. FIG. 1 shows a driver (or buffer) in front of an ADC, illustrating a part of an exemplary receiver signal chain, according to some embodiments of the disclosure. Circuit 100 is shown to include a driver 102 and an ADC 104. The driver 102 can be on-chip (provided on the same die) as ADC 104. The driver 102 receives an analog input (shown as INPUT). The analog input is received from preceding external circuitry. The driver 102 can buffer and/or amplify the analog input. An output of the driver 102 is provided as input to ADC 104. The ADC 104 can digitize the output of the driver 102 and generate a digital output (shown as OUTPUT). In the depicted example, ADC 104 has a switched-capacitor sampler, which is illustrated by switch 106 and sampling capacitor $C_{SAM}$ 108. The digital output generated by ADC 104 can be provided to digital signal processing blocks for further processing.

The ever-increasing bandwidth needs of high-performance RF ADCs have rendered the use of an on-chip front-end driver (or buffer), such as the driver 102, indispensable. The on-chip front-end driver advantageously isolates the RF ADC, such as the ADC 104, from preceding external circuitry. Additionally, the on-chip front-end driver can provide gain to compensate for any signal roll-off prior to the RF ADC.

While it is desirable to have the front-end driver, designing such a front-end driver is not trivial. Most high-resolution (e.g., greater than 10 bits of resolution), high speed (e.g., giga-samples per second) RF ADCs, due to their switched-capacitor input load (e.g., sampler in ADC 104), require high-performance on-chip analog drivers to provide a constant load to the preceding external circuitry and simplify the interfacing from off-chip to on-chip with minimum performance loss. Moreover, the demands on performance and need to lower power consumption can present great challenges to designing the front-end driver. The overall noise and linearity of signal chain performance are determined by the combination of the dynamic performance of each functional block in the receiver signal chain. Accordingly, the input circuitry noise and linearity performance are often specified to be comparable, or possibly higher than the ADC's performance. The noise and linearity of this driver may need to be higher than the back-end ADC, so as to not exacerbate the performance of the total signal chain. As a result the driver may heavily dominate overall power consumption, and even worse, limit overall bandwidth.

Limitations of Certain Unity Gain Buffers

Figure 2:
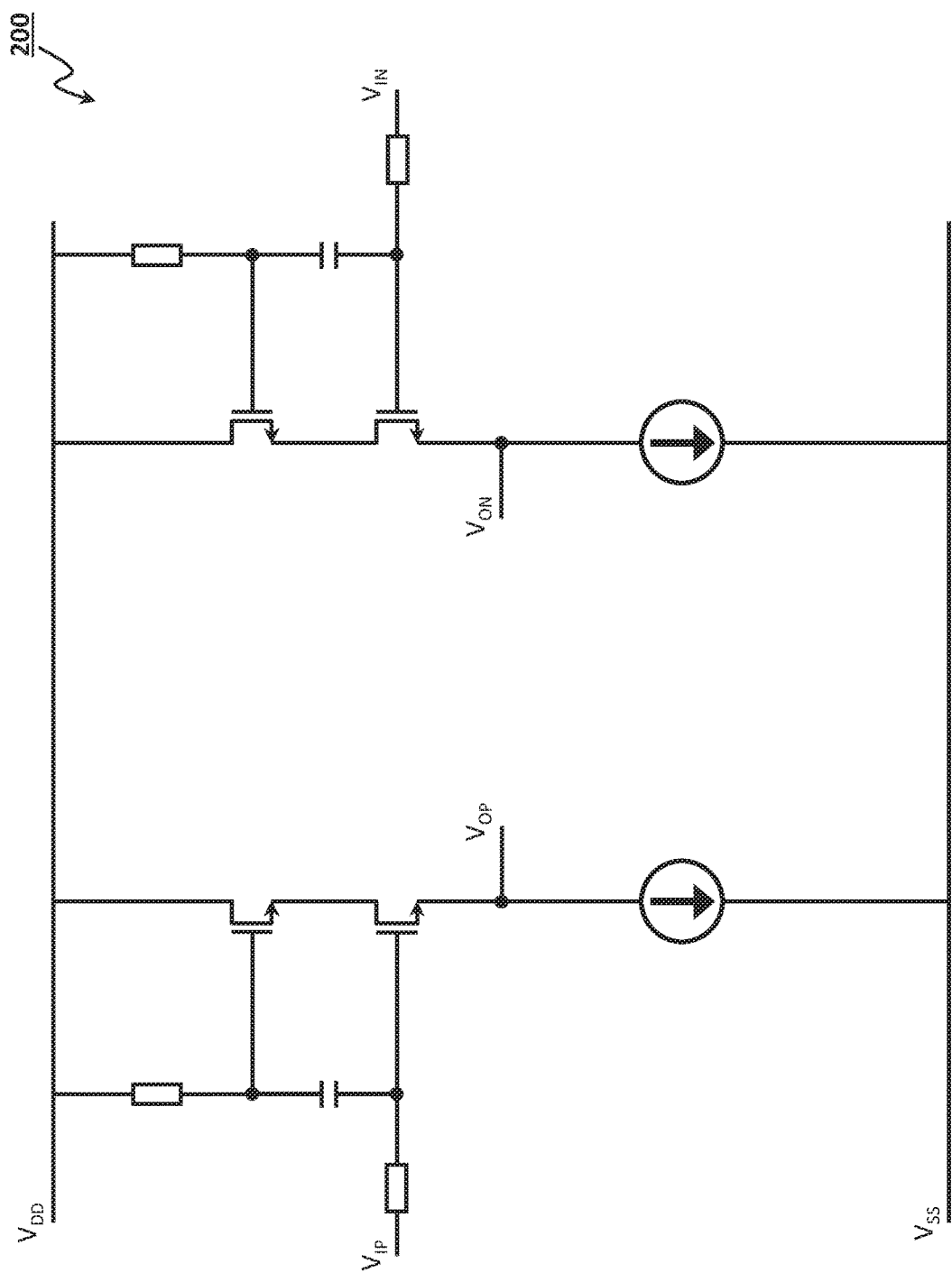
FIG. 2 shows an exemplary Class-A unity gain buffer.

To provide a high input bandwidth, a Class-A unity gain buffer can be used as the driver in front of an RF ADC. Class-A operation means that the active transistor devices in the buffer conduct over an entire range of the input signal. In other words, the active transistor devices remain conducting all the time. FIG. 2 shows an exemplary Class-A unity gain buffer 200. The Class-A unity gain buffer 200 reduces the loading and impedance variations on the external source and actively drives the noise-dictated large sampling capacitor in the RF ADC (e.g., in the order of 500 fF or more). To achieve a low enough output impedance ($R_{OUT} \approx 1/G_m$, $G_m$ being the transconductance of a transistor device), the Class-A unity gain buffer 200 can dissipate an equivalent or higher power compared to the back-end ADC. Furthermore, the buffer significantly limits the available swing, while the buffer's additive noise and non-linearity deteriorate the total signal chain spectral purity.

Figure 3:
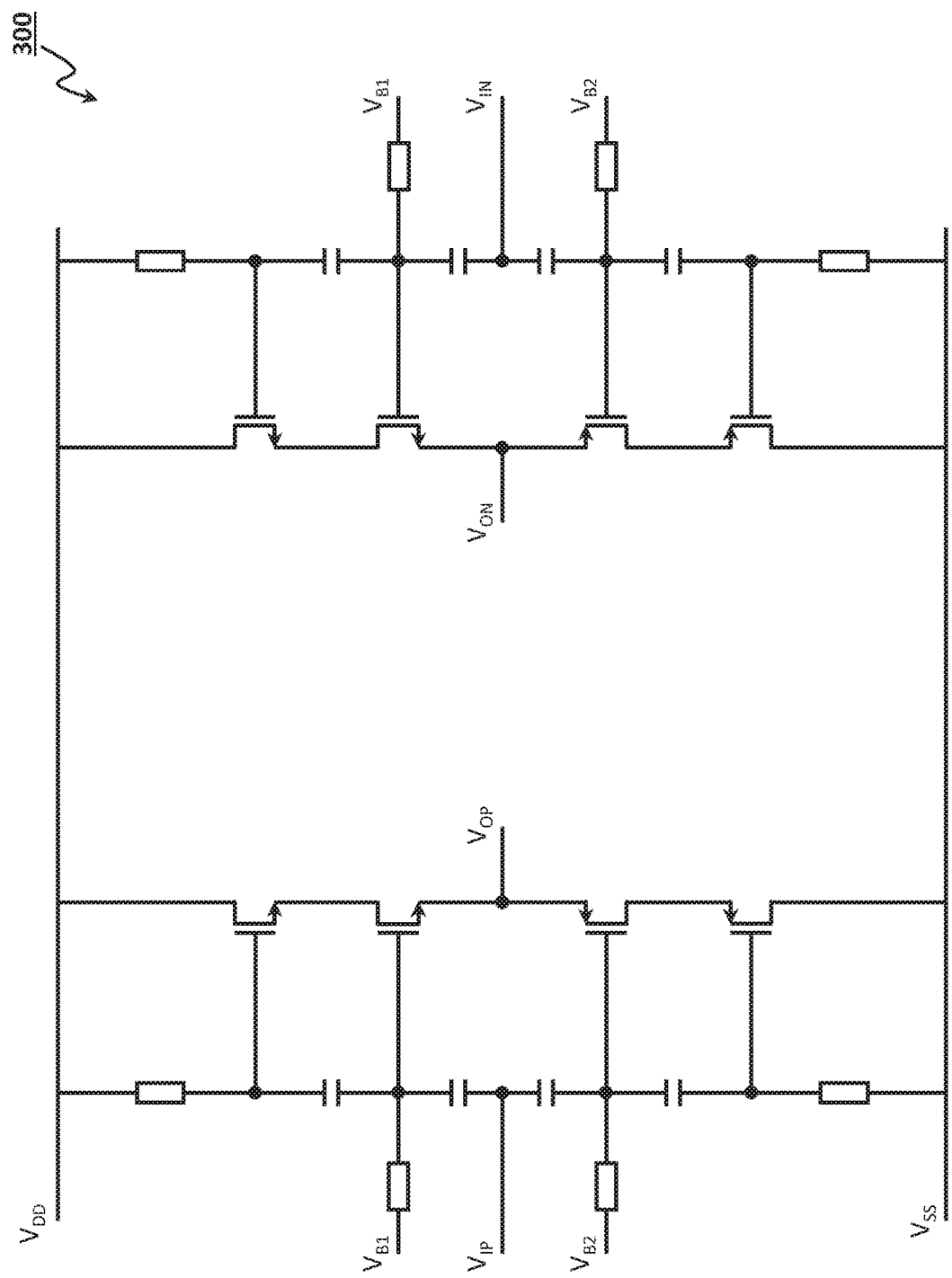
FIG. 3 shows an exemplary Class-AB unity gain buffer.

To reduce power consumption, a Class-AB unity gain buffer can be used as the driver in front of an RF ADC instead of a Class-A unity gain buffer. Class-AB operation means that one of two active transistor devices conduct about half of the time or a little bit more than half of the time. In other words, one active transistor device conducts over half of the input waveform, and the other active transistor device conducts over the other half of the input waveform. FIG. 3 shows an exemplary Class-AB unity gain buffer 300. The Class-AB unity gain buffer 300 leverages current re-use to effectively double the transconductance $G_m$ for the same current or half the current for the same total $G_m$.

Nevertheless, either Class-A or Class-AB operation, due to their large transistor devices needed for a sufficient transconductance $G_m$, the input capacitance of these buffers rises significantly, which can excessively load the preceding circuitry. Moreover, these buffers' isolation is not as effective at high frequencies (e.g., frequencies above several GHz) as their low frequency counterparts. Furthermore, these buffers' dynamic non-linearity rises considerably at high frequencies, thereby limiting the total signal chain performance. Finally, these buffers can only provide a maximum gain of one, therefore these buffers' cannot provide any amplification or gain. Therefore, these buffers would not be suitable in cases where a wideband signal gain is desired to compensate for any signal loss prior to the ADC, and to avoid a signal-to-noise ratio degradation of the receiver signal chain.

Improved Class-AB Drivers in Front of an RF ADC

A new and improved driver architecture and its operations are illustrated by FIGS. 4-7. The driver architecture is characterized by a hybrid architecture that combines common-gate (CG) design and common-source (CS) design. Specifically, the driver architecture provides dual, parallel input-to-output current paths, where one current path has the CG design, and the other current path has the CS design. The two parallel current paths improves output bandwidth as well as ADC input loading to any preceding external circuitry. The driver architecture can greatly enhance the input bandwidth, while simultaneously improve the linearity and noise performance, plus lower power consumption. Because of current re-use, the Class-AB operation of the driver architecture allows for noise and power reduction. Finally, the driver architecture has a load resistor which can be used to provide fixed or variable gain. The gain can advantageously compensate for any signal loss prior to the ADC, and avoid signal-to-noise ratio degradation of the receiver signal chain.

The following passages describes amplifiers exemplifying and implementing the new and improved driver architecture. The amplifiers are shown in differential form. Additionally, the amplifiers include several transistor devices (or transistors). The transistor devices can be implemented as field-effect transistors (FETs). FETs generally have several terminals: drain, source, and gate. Transistors can be of one of two types: n-channel or n-type, and p-channel or p-type. The two types are complementary to each other. FETs can be fabricated in different types of semiconductor process technologies, such as complementary metal-oxide-semiconductor (CMOS) technology, Silicon On Insulator (SOI) technology, or fin field-effect transistors (FinFET) technology. When the amplifier is provided on-chip with the RF ADC, the choice of semiconductor process technology for the amplifier is likely dictated by the semiconductor process technology of the RF ADC, so as to avoid having to integrate two different types of semiconductor process technologies into a single integrated circuit device.

Figure 4:
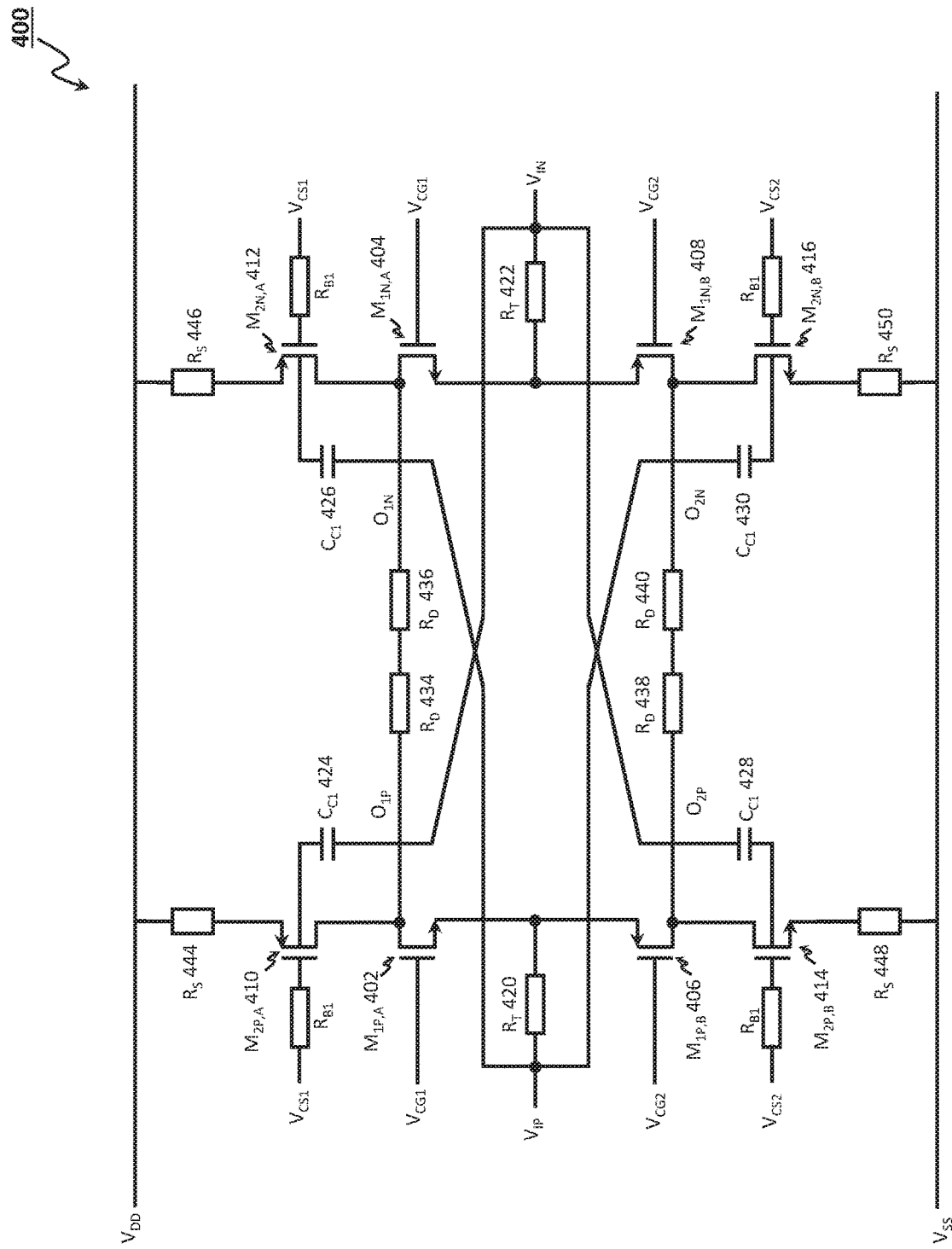
FIG. 4 shows an exemplary hybrid Class-AB amplifier, according to some embodiments of the disclosure.

FIG. 4 shows an exemplary hybrid CG-CS Class-AB amplifier 400, according to some embodiments of the disclosure. The amplifier 400 receives a differential input, represented by [$V_{IP}$, $V_{IN}$]. The amplifier 400 generates two differential outputs, represented by (differential) output, [$O_{1P}$, $O_{1N}$], and further (differential) output, [$O_{2P}$, $O_{2N}$].

The amplifier 400 has several transistor devices, including: transistor $M_{1P,A}$ 402, transistor $M_{1N,A}$ 404, transistor $M_{1P,B}$ 406, transistor $M_{1N,B}$ 408, transistor $M_{2P,A}$ 410, transistor $M_{2N,A}$ 412, transistor $M_{2P,B}$ 414, and transistor $M_{2N,B}$ 416.

$M_{1P,A}$ 402 and $M_{1N,A}$ 404 form a first pair of transistors to receive the input at sources of the first pair of transistors and generate the output at drains of the first pair of transistors. Therefore, the first pair of transistors has a common-gate configuration.

$M_{1P,A}$ 402 receives, at a source of $M_{1P,A}$ 402, an input signal from $V_{IP}$.

$M_{1P,A}$ 402 outputs, at a drain of $M_{1P,A}$ 402, an output signal at $O_{1P}$.

$M_{1N,A}$ 404 receives, at a source of $M_{1N,A}$ 404, the input signal from $V_{IN}$.

$M_{1N,A}$ 404 outputs, at a drain of $M_{1N,A}$ 404, the output signal at $O_{1N}$.

$M_{2P,A}$ 410 and $M_{2N,A}$ 412, form a second pair of transistors to receive the input at gates of the second pair of transistors and generate the output at drains of the second pair of transistors. Therefore, the second pair of transistors has a common-source configuration. Additionally, the second pair of transistors is in cascode configuration with the first pair of transistors. In addition to being cascode transistors, the second pair of transistors, receives the input signal, and provides an additional input-to-output current path parallel to the input-to-output current path provided by the first pair of transistors. In particular, the input signal is cross-coupled to the gates of the second pair of transistors.

$M_{2P,A}$ 410 receives, at a gate of $M_{2P,A}$ 410, the input signal from $V_{IN}$.

$M_{2P,A}$ 410 outputs, at a drain of $M_{2P,A}$ 410, the output signal at $O_{1P}$.

$M_{2P,A}$ 410 is in cascode configuration with $M_{1P,A}$ 402, meaning: a drain of $M_{1P,A}$ 402 is connected to a drain of $M_{2P,A}$ 410 at $O_{1P}$.

$M_{2N,A}$ 412 receives, at a gate of $M_{2N,A}$ 412, the input signal from $V_{IP}$.

$M_{2N,A}$ 412 outputs, at a drain of $M_{2N,A}$ 412, the output signal at $O_{1N}$.

$M_{2N,A}$ 412 is in cascode configuration with $M_{1N,A}$ 404, meaning: a drain of $M_{1N,A}$ 404 is connected to a drain of $M_{2N,A}$ 412 at $O_{1N}$.

$M_{1P,B}$ 406 and $M_{1N,B}$ 408 form the third pair of transistors. The third pair of transistors receives the input at sources of the third pair of transistors and generates a further output at drains of the third pair of transistors. Therefore, the third pair of transistors has a common-gate configuration.

$M_{1P,B}$ 406 receives, at a source of $M_{1P,B}$ 406, an input signal from $V_{IP}$.

$M_{1P,B}$ 406 outputs, at a drain of $M_{1P,B}$ 406, an output signal at $O_{2P}$.

$M_{1N,B}$ 408 receives, at a source of $M_{1N,B}$ 408, the input signal from $V_{IN}$.

$M_{1N,B}$ 408 outputs, at a drain of $M_{1N,B}$ 408, the output signal at $O_{2N}$.

$M_{2P,B}$ 414 and $M_{2N,B}$ 416 form the fourth pair of transistors. The fourth pair of transistors receives the input at gates of the fourth pair of transistors and generate the output at drains of the fourth pair of transistors. Therefore, the fourth pair of transistors has a common-source configuration. Additionally, the fourth pair of transistors is in cascode configuration with the third pair of transistors. In addition to being cascode transistors, the fourth pair of transistors, receives the input signal, and provides an additional input-to-output current path parallel to the input-to-output current path provided by the third pair of transistors. In particular, the input signal is cross-coupled to the gates of the fourth pair of transistors.

- $M_{2P,B}$ 414 receives, at a gate of $M_{2P,B}$ 414, the input signal from $V_{IN}$.
- $M_{2P,B}$ 414 outputs, at a drain of $M_{2P,B}$ 414, the output signal at $O_{2P}$.
- $M_{2P,B}$ 414 is in cascode configuration with $M_{1P,A}$ 406 meaning: a drain of $M_{1P,A}$ 406 is connected to a drain of $M_{2P,B}$ 414 at $O_{2P}$.
- $M_{2N,B}$ 416 receives, at a gate of $M_{2N,B}$ 416, the input signal from $V_{IP}$.
- $M_{2N,B}$ 416 outputs, at a drain of $M_{2N,B}$ 416, the output signal at $O_{2N}$.
- $M_{2N,B}$ 416 is in cascode configuration with $M_{1N,B}$ 408 meaning: a drain of $M_{1N,B}$ 408 is connected to a drain of $M_{2N,B}$ 416 at $O_{2N}$.

Class-AB Operation with Complementary Transistor Devices Yields Power Savings

For Class-AB operation, amplifier 400 has active transistor devices receiving the input signal which are complementary to each other, such that one set of active transistor devices of a first type conducts half of the time and the other set of active transistor devices of a second type complementary to the first type conducts the other half of the time. Such Class-AB operation can offer power savings when compared to amplifiers with Class-A operation.

The first and fourth pairs of transistors can be of the first type, and the second and third pair of transistors can be of the second type complementary to the first type. For instance, if the first and fourth pairs of transistors are n-channel transistors, then the second and third pairs of transistors are p-channel transistors. The first pair of transistors and the third pair of transistors are complementary to each other. The second pair of transistors and the fourth pair of transistors are complementary to each other. The first pair of transistors and the second pair of transistors are complementary to each other. The third pair of transistors and the fourth pair of transistors are complementary to each other.

- $M_{1P,A}$ 402 and $M_{1N,A}$ 404 (the first pair of transistors) can be of a first type (e.g., n-channel, or n-type).
- $M_{2P,A}$ 410 and $M_{2N,A}$ 412 (the second pair of transistors) can be of a second type (e.g., p-channel or p-type) complementary to the first type.
- $M_{1P,B}$ 406 and $M_{1N,B}$ 408 (the third pair of transistors) can be of the second type (e.g., p-channel or p-type) complementary to the first type.
- $M_{2P,B}$ 414 and $M_{2N,B}$ 416 (the fourth pair of transistors) can be of the first type (e.g., n-channel, or n-type).

Termination Resistance, Source Degeneration for Common-Gate Transistor Devices, and Total Input Termination In some embodiments, the amplifier 400 has termination resistors, e.g., $R_T$ 420 and $R_T$ 422, at the input, specifically, between the input and the sources of the first pair of transistors and between the input and the sources of the third pair of transistors. Amplifier 400 has a total input termination that comprises the termination resistor in series with the reciprocal of transconductances of the transistors receiving the input signal in parallel. Consider the path from $V_{IP}$ to $O_{1P}$, the total input termination is the sum of resistance of the $R_T$ 420 and $$\frac{1}{G_{m1P,A} + G_{m2P,A}},$$

where $G_{m1P,A}$ is the transconductance of $M_{1P,A}$ 402, and $G_{m2P,A}$ is the transconductance of $M_{2P,A}$ 410. Because the termination resistors, e.g., $R_T$ 420 and $R_T$ 422, are connected to the sources of the first pair of transistors (i.e., the common-gate transistor devices), the termination resistors also serve as a source degeneration resistor that can improve the (low frequency) linearity of amplifier 400.

- $V_{IP}$, is connected to the source of $M_{1P,A}$ 402, through termination resistor, $R_T$ 420.
- $V_{IP}$, is connected to the source of $M_{1P,B}$ 406, through termination resistor, $R_T$ 420.
- $V_{IN}$, is connected to the source of $M_{1N,A}$ 404, through termination resistor, $R_T$ 422.
- $V_{IN}$, is connected to the source of $M_{1N,B}$ 408, through termination resistor, $R_T$ 422.

Alternating Current (AC) Coupling Capacitors for Common-Source Transistor Devices The input, $[V_{IN}, V_{IP}]$, is cross-coupled to the gates of the second pair of transistors. The input, $[V_{IN}, V_{IP}]$, is cross-coupled to the gates of the fourth pair of transistors. In some embodiments, the amplifier has AC coupling capacitors, e.g., $C_{C1}$ 424, $C_{C1}$ 426, $C_{C1}$ 428, and $C_{C1}$ 430, between the input and gates of the second pair of transistors, and between the input and gates of the fourth pair of transistors. In other words, the input is cross-coupled to the gates of the second pair of transistors, $M_{2P,A}$ 410 and $M_{2N,A}$ 412, via a first pair of AC coupling capacitors, $C_{C1}$ 424 and $C_{C1}$ 426. The input is cross-coupled to the gates of the fourth pair of transistors, $M_{2P,B}$ 414 and $M_{2N,B}$ 416, via a second pair of AC coupling capacitors, $C_{C1}$ 428 and $C_{C1}$ 430.

- $M_{2P,A}$ 410 receives, at the gate of $M_{2P,A}$ 410, the input signal from $V_{IN}$, via AC coupling capacitor, $C_{C1}$ 424.
- $M_{2N,A}$ 412 receives, at the gate of $M_{2N,A}$ 412, the input signal from $V_{IP}$, via AC coupling capacitor, via $C_{C1}$ 426.
- $M_{2P,B}$ 414 receives, at the gate of $M_{2P,B}$ 414, the input signal from $V_{IN}$, via AC coupling capacitor, $C_{C1}$ 428.
- $M_{2N,B}$ 416 receives, at the gate of $M_{2N,B}$ 416, the input signal from $V_{IP}$, via AC coupling capacitor, $C_{C1}$ 430.

Load Resistance, and Gain of Amplifier

In some embodiments, amplifier 400 has load resistors, e.g., $R_D$ 434, $R_D$ 436, $R_D$ 438, $R_D$ 440, at the output, $[O_{1P}, O_{1N}]$, and the further output, $[O_{2P}, O_{2N}]$. For instance, $R_D$ 434 and $R_D$ 436 are provided (in series) between $O_{1P}$, and $O_{1N}$. $R_D$ 438 and $R_D$ 440 are provided (in series) between $O_{2P}$, and $O_{2N}$.

Amplifier 400 has common-gate transistor devices and common-source transistor devices that amplify the input signal in a parallel fashion. The parallel current paths result in a gain of $G_{m1} + G_{m2}$ for a fixed load resistance $R_D$, where $G_{m1}$ is the transconductance of a common-gate transistor device, and $G_{m2}$ is the transconductance of a common-source transistor device. Non-unity gain can easily be achieved.

Biasing Gates of Transistor Devices

Transistor devices in amplifier 400, specifically, gates of transistor devices, are biased with biasing voltages: biasing voltage $V_{CG1}$, biasing voltage $V_{CS1}$, biasing voltage $V_{CG2}$, and biasing voltage $V_{CS2}$. Optionally, biasing resistor (e.g., $R_{B1}$) is provided at the gate of a transistor device (e.g., the common-source transistor devices). A given biasing voltage can be generated from a bandgap generator, or a dedicated biasing circuit (e.g., a common-mode feedback circuit). Common-mode feedback circuits can be implemented to sense the output common-mode voltage of amplifier 400 and generate a biasing voltage based on the sensed output common-mode voltage and a target output common-mode voltage.

Gate of $M_{1P,A}$ 402 is biased by biasing voltage $V_{CG1}$.
Gate of $M_{1N,A}$ 404 is biased by biasing voltage $V_{CG1}$.
Gate of $M_{2P,A}$ 410 is biased by biasing voltage $V_{CS1}$, optionally through biasing resistor $R_{B1}$.
Gate of $M_{2N,A}$ 412 is biased by biasing voltage $V_{CS1}$, optionally through biasing resistor $R_{B1}$.
Gate of $M_{1P,B}$ 406 is biased by biasing voltage $V_{CG2}$.
Gate of $M_{1N,B}$ 408 is biased by biasing voltage $V_{CG2}$.
Gate of $M_{2P,B}$ 414 is biased by biasing voltage $V_{CS2}$, optionally through biasing resistor $R_{B1}$.
Gate of $M_{2N,B}$ 416 is biased by biasing voltage $V_{CS2}$, optionally through biasing resistor $R_{B1}$.

Source Degeneration for Common-Source Transistor Devices

In some embodiments, amplifier 400 has first degeneration resistors at sources of the second pair of transistors and second degeneration resistors sources of the fourth pair of transistors. The degeneration resistors provide source degeneration, which in turn improves (low frequency) linearity of amplifier 400.

Degeneration resistor $R_S$ 444 is connected between $V_{DD}$ (a first supply) and source of $M_{2P,A}$ 410.
Degeneration resistor $R_S$ 446 is connected between $V_{DD}$ (the first supply) and source of $M_{2N,A}$ 414.
Degeneration resistor $R_S$ 448 is connected between $V_{SS}$ (a second supply) and source of $M_{2P,B}$ 414.
Degeneration resistor $R_S$ 450 is connected between $V_{SS}$ (the second supply) and source of $M_{2N,B}$ 416.

Advantages of the Hybrid CG-CS Amplifier Design

Having parallel common-gate and common-source current paths in an amplifier with Class-AB operation can provide surprising synergistic technical effects: improved bandwidth, improved linearity, and lower power consumption.

For a fixed load resistance, e.g., $R_D$, which primarily determines the output bandwidth, the gain of amplifier 400 can be increased by an equivalent amount of $$\frac{G_{m1} + G_{m2}}{G_{m1}}.$$

In the alternative, for a fixed gain, the bandwidth of amplifier 400 can be increased by reducing load resistance, $R_D$. The amplifier architecture offers flexibility in trading off between bandwidth and gain.

Additionally, because a fixed gain can be achieved with current summation of two parallel common-gate and common-source current paths, a smaller resistor than what would otherwise be required if just one current path is used to deliver the same fixed gain can be used as the load resistance. In other words, the amplifier architecture having two parallel current paths reduces the size of the load resistor for an equivalent amount of bandwidth enhancement proportional to the signal gain (e.g., sum of gain CG of common-gate path and gain CS of common-source path divided by gain CG of common-gate path, or $$\frac{CG + CS}{CG})$$

or transconductance allocation.

If the load resistance e.g., $R_D$, is implemented using a device with adjustable resistance, the gain of the amplifier 400 can be varied or programmed. Conversely, the bandwidth can also be varied or programmed.

Having common-gate and common-source current paths perform amplification in parallel also means that the transistor devices themselves can be made smaller for a fixed gain, when compared to the case where a pair of transistor devices implements a sole common-source current path achieving the same fixed gain.

Two characteristics of the amplifier architecture reduce the input loading for a fixed gain. For the common-gate current path, most of the input capacitance is hidden behind termination resistor $R_T$, while the remaining capacitance is reduced by the amount above due to the parallel path. For the common-source current path, the input loading is again reduced by the same amount as above, when compared to the case where a sole common-source current path would need to achieve the same gain.

Due to the size reduction of the devices as mentioned above and the property of the transistor devices in the common-gate current path to hide the input load behind the termination resistor $R_T$, the total input capacitive loading of amplifier 400 is reduced, which results in a smaller and more constant load to the circuitry preceding the amplifier 400. Such a benefit can ease the drivability for the preceding circuitry and maintain the bandwidth enhancement merits across the entire receive signal chain.

The device size reductions bring an additional benefit in the linearity of the circuit. As mentioned above, the low frequency, static linearity is improved by the (simultaneous) resistive source degeneration in both common-gate current path and common-source current path. The high frequency (or dynamic) linearity, which is dominated by the parasitic capacitances, can be also substantially improved due to the reduction in the device sizes. This results in an overall better and more constant linearity over a large range of frequencies, making any potential non-linear correction (if needed) a simple much less power hungry polynomial fit compared to other correction models. The amplifier 400 thus has enhanced linearity (both static and dynamic) for a certain gain and bandwidth. Furthermore, since the transistor devices can now be smaller to realize a certain total transconductance and gain, the output capacitive loading from the transistor devices is reduced, resulting in an improved and relatively flat linearity across the entire bandwidth.

The amplifier architecture improves the power consumption and noise due to its fully Class-AB operation on both common-gate and common-source current paths by re-using the current and having both signal and noise processed by all transistor devices, in contrast to a Class-A approach where the current sources contribute noise gain but not signal gain. Current re-use does not waste current and allows for all the transistor devices to process both signal and noise.

If an on-chip calibration is implemented, the flat linearity property of the amplifier 400 improves the power consumption of the entire receiver signal chain by allowing a simple single point polynomial fit linearization, compared to other power hungry approaches. Accordingly, the power budget needed for calibration is lowered.

Various embodiments disclosed herein have complementary devices in the design. The complementary devices provide for Class-AB operation. The complementary nature of the architecture is beneficial when the complementary devices are implemented/fabricated using technologies or semiconductor processes with increasing symmetry between n-type and p-type devices (or technologies or semiconductor processes where the sizes for n-type and p-type devices are similar for the same current). For instance, the amplifier can be implemented in 16 nm (or finer geometry) semiconductor process, which benefits from having complementary devices with symmetric behavior. When the complementary devices are considered symmetrical, then there is a linearity benefit in terms of better suppression of even-order distortion due to the near-perfect complementary nature. When one device sources the current the other one sinks it with the complementary capability, symmetry of the complementary devices can help suppress even-order distortion. Accordingly, the architecture with complementary devices implemented in technologies or processes having symmetry between p-type and n-type devices can achieve better performance in terms of harmonic distortion. Additionally, if parasitics are the same between the complementary pull-up and pull-down paths, then the power benefit of Class-AB operation of the amplifier would is closer to the theoretical power savings of one half of the power consumed by counterpart Class-A amplifier. Moreover, the high frequency distortion or non-linearity due to those parasitics would be the same for a high signal as well as for a low signal, which can make its characterization and potentially its correction (if needed) easier and power efficient.

Improved Class-AB Drivers in Front of an RF ADC with Folded Cascodes

Figure 5:
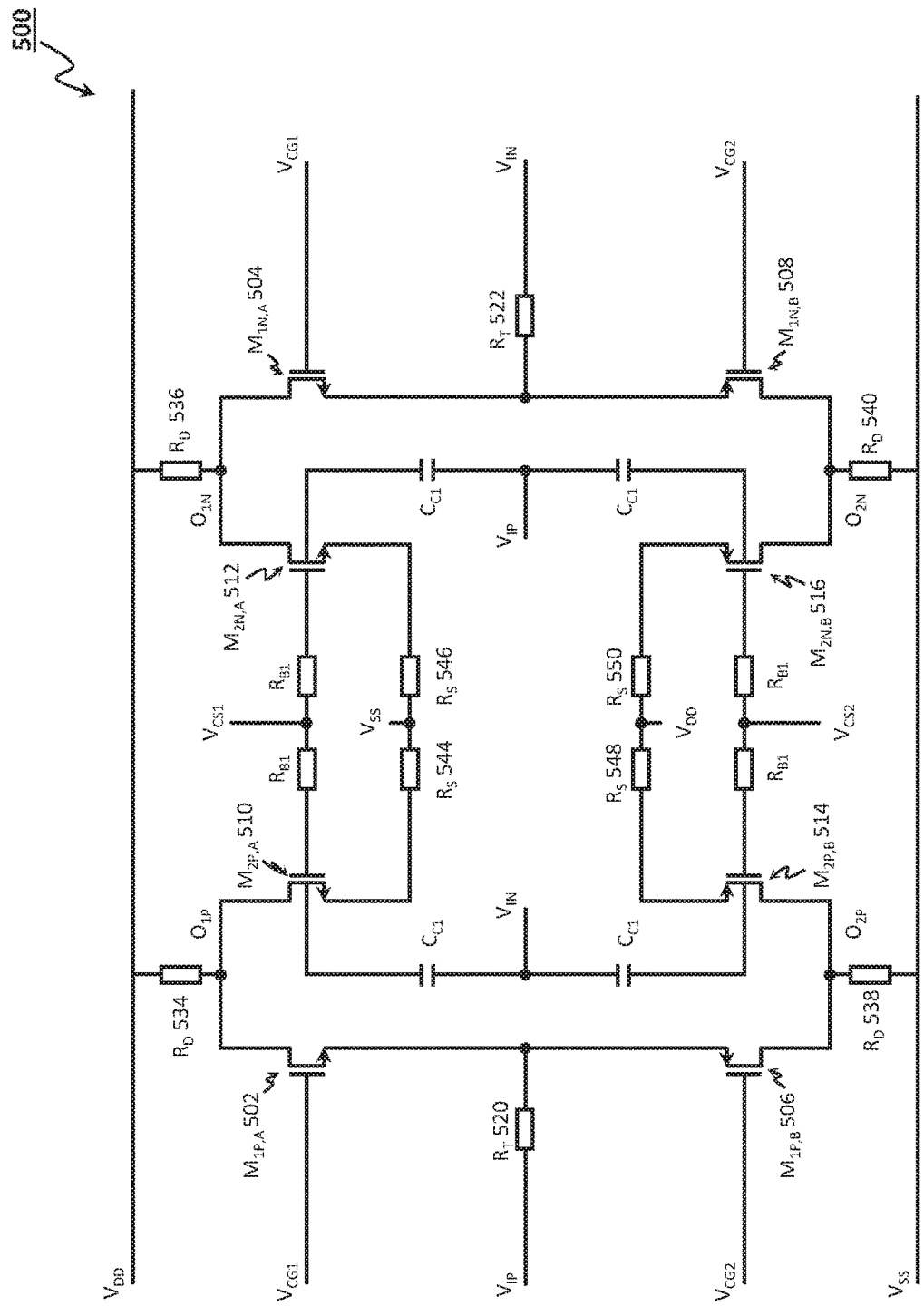
FIG. 5 shows an exemplary hybrid Class-AB amplifier with folded cascodes, according to some embodiments of the disclosure.

FIG. 5 shows an exemplary hybrid CG-CS Class-AB amplifier 500 with folded cascodes, according to some embodiments of the disclosure. One or more advantages described herein with respect to amplifier 400 are also applicable to amplifier 500. Amplifier 500 has several transistor devices, including: transistor $M_{1P,A}$ 502, transistor $M_{1N,A}$ 504, transistor $M_{1P,B}$ 506, transistor $M_{1N,B}$ 508, transistor $M_{2P,A}$ 510, transistor $M_{2N,A}$ 512, transistor $M_{2P,B}$ 514, and transistor $M_{2N,B}$ 516. Amplifier 500 is similar to amplifier 400 of FIG. 4.

$M_{1P,A}$ 502 and $M_{1N,A}$ 504 form a first pair of transistors to receive the input at sources of the first pair of transistors and generate the output at drains of the first pair of transistors. Therefore, the first pair of transistors has a common-gate configuration.

$M_{1P,A}$ 502 receives, at a source of $M_{1P,A}$ 502, an input signal from $V_{IP}$.

$M_{1P,A}$ 502 outputs, at a drain of $M_{1P,A}$ 502, an output signal at $O_{1P}$.

$M_{1N,A}$ 504 receives, at a source of $M_{1N,A}$ 504, the input signal from $V_{IN}$.

$M_{1N,A}$ 504 outputs, at a drain of $M_{1N,A}$ 504, the output signal at $O_{1N}$.

$M_{2P,A}$ 510 and $M_{2N,A}$ 512 form a second pair of transistors to receive the input at gates of the second pair of transistors and generate the output at drains of the second pair of transistors. Therefore, the second pair of transistors has a common-source configuration. Additionally, the second pair of transistors is in folded cascode configuration with the first pair of transistors. In addition to being cascode transistors, the second pair of transistors, receives the input signal, and provides an additional input-to-output current path parallel to the input-to-output current path provided by the first pair of transistors. In particular, the input signal is cross-coupled to the gates of the second pair of transistors.

$M_{2P,A}$ 510 receives, at a gate of $M_{2P,A}$ 510, the input signal from $V_{IN}$.

$M_{2P,A}$ 510 outputs, at a drain of $M_{2P,A}$ 510, the output signal at $O_{1P}$.

$M_{2P,A}$ 510 is in folded cascode configuration with $M_{1P,A}$ 502 meaning: a drain of $M_{1P,A}$ 502, is connected to a drain of $M_{2P,A}$ 510 at $O_{1P}$.

$M_{2N,A}$ 512 receives, at a gate of $M_{2N,A}$ 512, the input signal from $V_{IP}$.

$M_{2N,A}$ 512 outputs, at a drain of $M_{2N,A}$ 512, the output signal at $O_{1N}$.

$M_{2N,A}$ 512 is in folded cascode configuration with $M_{1N,A}$ 504 meaning: a drain of $M_{1N,A}$ 504 is connected to a drain of $M_{2N,A}$ 512 at $O_{1N}$.

$M_{1P,B}$ 506 and $M_{1N,B}$ 508 form the third pair of transistors. The third pair of transistors receives the input at sources of the third pair of transistors and generates a further output at drains of the third pair of transistors. Therefore, the third pair of transistors has a common-gate configuration.

$M_{1P,B}$ 506 receives, at a source of $M_{1P,B}$ 506, an input signal from $V_{IP}$.

$M_{1P,B}$ 506 outputs, at a drain of $M_{1P,B}$ 506, an output signal at $O_{2P}$.

$M_{1N,B}$ 508 receives, at a source of $M_{1N,B}$ 508, the input signal from $V_{IN}$.

$M_{1N,B}$ 508 outputs, at a drain of $M_{1N,B}$ 508, the output signal at $O_{2N}$.

$M_{2P,B}$ 514 and $M_{2N,B}$ 516 form the fourth pair of transistors. The fourth pair of transistors receives the input at gates of the fourth pair of transistors and generate the output at drains of the fourth pair of transistors. Therefore, the fourth pair of transistors has a common-source configuration. Additionally, the fourth pair of transistors is in folded cascode configuration with the third pair of transistors. In addition to being cascode transistors, the fourth pair of transistors, receives the input signal, and provides an additional input-to-output current path parallel to the input-to-output current path provided by the third pair of transistors. In particular, the input signal is cross-coupled to the gates of the fourth pair of transistors.

$M_{2P,B}$ 514 receives, at a gate of $M_{2P,B}$ 514, the input signal from $V_{IN}$.

$M_{2P,B}$ 514 outputs, at a drain of $M_{2P,B}$ 514, the output signal at $O_{2P}$.

$M_{2P,B}$ 514 is in folded cascode configuration with $M_{1P,A}$ 506 meaning: a drain of $M_{1P,A}$ 506 is connected to a drain of $M_{2P,B}$ 514 at $O_{2P}$.

$M_{2N,B}$ 516 receives, at a gate of $M_{2N,B}$ 516, the input signal from $V_{IP}$.

$M_{2N,B}$ 516 outputs, at a drain of $M_{2N,B}$ 516, the output signal at $O_{2N}$.

$M_{2N,B}$ 516 is in folded cascode configuration with $M_{1N,B}$ 508 meaning: a drain of $M_{1N,B}$ 508 is connected to a drain of $M_{2N,B}$ 516 at $O_{2N}$.

Because the second pair of transistors and the fourth pair of transistors are implemented in a folded cascode configuration with the first pair of transistors and the third pair of transistors respectively, amplifier 500 has less devices connected across the supplies, $V_{DD}$, and $V_{SS}$. Amplifier 500 could consume less headroom when compared to amplifier 400 of FIG. 4.

Similar to amplifier 400, amplifier 500 has Class-AB operation, and comprises complementary transistor devices.

The first and second pairs of transistors can be of a first type, and the third and fourth pairs of transistors can be of a second type complementary to the first type. For instance, first and second pairs of transistors can be of n-channel transistor devices, and third and fourth pairs of transistors can be p-channel transistor devices.

Similar to amplifier 400, amplifier 500 has termination resistors, e.g., $R_T$ 520 and $R_T$ 522, at the input, specifically, between the input and the sources of the first pair of transistors and between the input and the sources of the third pair of transistors. Because the termination resistors, e.g., $R_T$ 520 and $R_T$ 522, are connected to the sources of the first pair of transistors (i.e., the common-gate transistor devices), the termination resistors also serve as a source degeneration resistor that can improve the (low frequency) linearity of amplifier 500.

Similar to amplifier 400, amplifier 500 has load resistance at the output and the further output as well. The load resistors, e.g., $R_D$ 534, $R_D$ 536, $R_D$ 538, $R_D$ 540, are connected across the output and one of the supplies.

Load resistor $R_D$ 534 is connected between $V_{DD}$ (the first supply) and $O_{1P}$ (i.e., where drains of $M_{2P,A}$ 502 and $M_{2P,A}$ 510 are connected together).

Load resistor $R_D$ 536 is connected between $V_{DD}$ (the first supply) and $O_{1N}$ (i.e., where drains of $M_{1N,A}$ 504 and $M_{2N,A}$ 512 are connected together).

Load resistor $R_D$ 538 is connected between $V_{SS}$ (the second supply) and $O_{2P}$ (i.e., where drains of $M_{1P,A}$ 506 and $M_{2P,B}$ 514 are connected together).

Load resistor $R_D$ 540 is connected between $V_{SS}$ (the first supply) and $O_{2N}$ (i.e., where drains of $M_{1N,B}$ 508 and $M_{2N,B}$ 516 are connected together).

Similar to amplifier 400, the common-gate transistor devices and common-source transistor devices in amplifier 500 have source degeneration resistors to help improve linearity of amplifier 500. As discussed above the termination resistors, e.g., $R_T$ 520 and $R_T$ 522, can serve as source degeneration resistors for the common-gate transistor devices. For the common-source transistor devices, e.g., the second pair of transistors and the fourth pair of transistors, source degeneration resistors can be provided between respective sources of the transistor devices and one of the supplies.

Degeneration resistor $R_S$ 544 is connected between $V_{SS}$ (the second supply) and source of $M_{2P,A}$ 510.

Degeneration resistor $R_S$ 546 is connected between $V_{SS}$ (the second supply) and source of $M_{2N,A}$ 514.

Degeneration resistor $R_S$ 548 is connected between $V_{DD}$ (the first supply) and source of $M_{2P,B}$ 514.

Degeneration resistor $R_S$ 550 is connected between $V_{DD}$ (the first supply) and source of $M_{2N,B}$ 516.

Similar to amplifier 400, transistor devices in amplifier 500, specifically, gates of transistor devices are biased with biasing voltages: biasing voltage $V_{CG1}$, biasing voltage $V_{CS1}$, biasing voltage $V_{CG2}$, and biasing voltage $V_{CS2}$. The biasing voltages in amplifier 500 can be generated in a similar fashion as amplifier 400. Optionally, biasing resistor (e.g., $R_{B1}$) is provided at the gate of a transistor device (e.g., the common-source transistor devices).

Optional Output Buffer Stage

Figure 6:
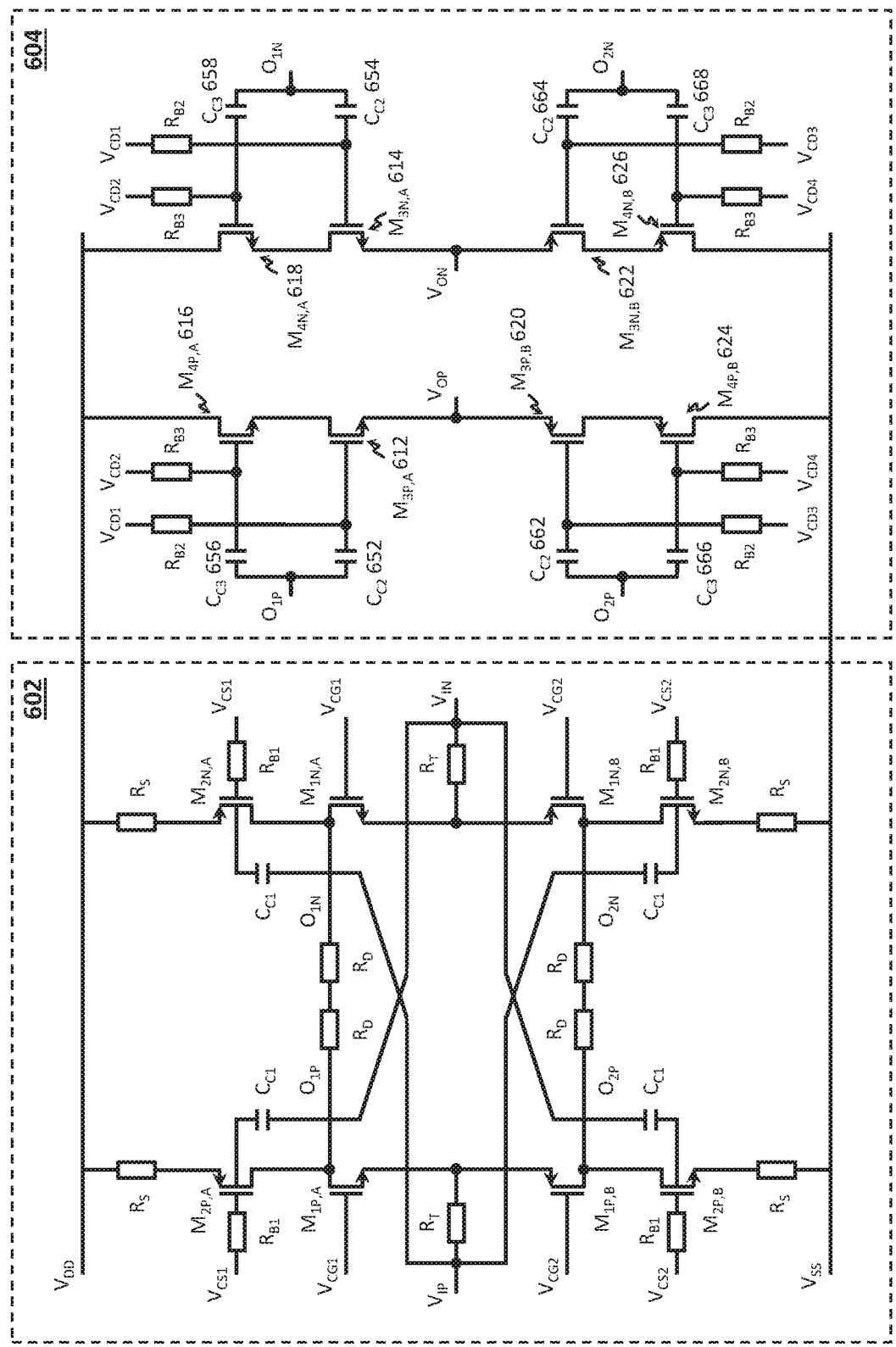
FIG. 6 shows an exemplary hybrid Class-AB amplifier input stage with an optional Class-AB unity gain buffer stage, according to some embodiments of the disclosure.

The output and further output of amplifier 400 and amplifier 500 can optionally be buffered by an output buffer, such as a unity gain buffer stage. FIG. 6 shows an exemplary hybrid CG-CS Class-AB amplifier input stage 602 with an optional Class-AB unity gain buffer stage 604, according to some embodiments of the disclosure. While the circuit diagram shows the input stage 602 implementing amplifier 400, it is appreciated that input stage 602 can be implemented with amplifier 500 (i.e., the version with folded cascodes). The buffer stage 604 receives the output, i.e., $[O_{1P}, O_{1N}]$, and further output, i.e., $[O_{2P}, O_{2N}]$, from input stage 602, and generates a buffered output, i.e., $[V_{OP}, V_{ON}]$. The buffer stage, serving as an output buffer, buffers the output and the further output from the input stage 602.

The buffer stage 604 comprises several transistor devices: transistor $M_{3P,A}$ 612, transistor $M_{3N,A}$ 614, transistor $M_{4P,A}$ 616, transistor $M_{4N,A}$ 618, transistor $M_{3P,B}$ 620, transistor $M_{3N,B}$ 622, transistor $M_{4P,B}$ 624, and transistor $M_{4N,B}$ 626.

$M_{3P,A}$ 612 and $M_{3N,A}$ 614 form a fifth pair of transistors to receive the output from input stage 602 at gates of the fifth pair of transistors, and generates a buffered output at sources of the fifth pair of transistors. Therefore, the fifth pair of transistors has a common-drain configuration.

$M_{3P,A}$ 612 receives, at the gate of $M_{3P,A}$ 612, an output signal of the input stage 602 from $O_{IP}$.

$M_{3P,A}$ 612 outputs, at the source of $M_{3P,A}$ 612, a buffered output signal at $V_{OP}$.

$M_{3N,A}$ 614 receives, at the gate of $M_{3N,A}$ 614, an output signal of the input stage 602 from the second one of the output, $O_{IN}$.

$M_{3N,A}$ 614 outputs, at the source of $M_{3N,A}$ 614, a buffered output signal at the second one of the buffered output, $V_{ON}$.

$M_{3P,B}$ 620 and $M_{3N,B}$ 622 form a sixth pair of transistors. The sixth pair of transistors are complementary to the fifth pair of transistor. The sixth pair of transistors receives the further output from input stage 602 at gates of the sixth pair of transistors and generates a buffered output at sources of the sixth pair of transistors. Therefore, the sixth pair of transistors has a common-drain configuration.

$M_{3P,B}$ 620 receives, at the gate of $M_{3P,B}$ 620, an output signal of the input stage 602 from $O_{2P}$.

$M_{3P,B}$ 620 outputs, at the source of $M_{3P,B}$ 620, a buffered output signal at $V_{OP}$.

$M_{3N,B}$ 622 receives, at the gate of $M_{3N,B}$ 622, an output signal of the input stage 602 from $O_{2N}$.

$M_{3N,B}$ 622 outputs, at the source of $M_{3N,B}$ 622, a buffered output signal at $V_{ON}$.

Accordingly, the fifth and sixth pair of transistors generate the buffered output, i.e., $[V_{OP}, V_{ON}]$, at the sources of the transistors.

Optionally, the buffer stage 604 can implement cascode transistors for the fifth and sixth pair of transistors, where the cascode transistors also receive and buffer the output signal from the input stage 602. Accordingly the cascode transistors offer further parallel current paths for the signal.

$M_{4P,A}$ 616 and $M_{4N,A}$ 618 form a seventh pair of transistors. The seventh pair of transistors is in cascode configuration with the fifth pair of transistors. The seventh pair of transistors additionally receives the output from input stage 602 at gates of the seventh pair of transistors, and outputs signal content at sources of the seventh pair of transistors. Therefore, the seventh pair of transistors has a common-drain configuration.

$M_{4P,A}$ 616 receives, at the gate of $M_{4P,A}$ 616, an output signal of the input stage 602 from $O_{IP}$.

$M_{4P,A}$ 616 outputs signal content, at the source of $M_{4P,A}$ 616, which is coupled to the drain of $M_{3P,A}$ 612. The signal content contributes to $V_{OP}$.

$M_{4N,A}$ 618 receives, at the gate of $M_{4N,A}$ 618, an output signal of the input stage 602 from $O_{IN}$.

$M_{4N,A}$ 618 outputs signal content, at the source of $M_{4N,A}$ 618, which is coupled to the drain of $M_{3N,A}$ 614. The signal content contributes to $V_{ON}$.

$M_{4P,B}$ 624 and $M_{4N,B}$ 626 form an eighth pair of transistors. The eighth pair of transistors is in cascode configuration with the sixth pair of transistors. The eighth pair of transistors additionally receives the further output from input stage 602 at gates of the eighth pair of transistors, and outputs signal content at sources of the eighth pair of transistors. Therefore, the eighth pair of transistors has a common-drain configuration.

$M_{4P,B}$ 624 receives, at the gate of $M_{4P,B}$ 624, a further output signal of the input stage 602 from $O_{2P}$.

$M_{4P,B}$ 624 outputs signal content, at the source of $M_{4P,B}$ 624, which is coupled to the drain of $M_{3P,B}$ 620. The signal content contributes to $V_{OP}$.

$M_{4N,B}$ 626 at the gate of $M_{4N,B}$ 626, the further output signal of the input stage 602 from $O_{2N}$.

$M_{4N,B}$ 626 outputs signal content, at the source of $M_{4N,B}$ 626, which is coupled to the drain of $M_{3N,B}$ 622. The signal content contributes to $V_{ON}$.

The buffer stage 604 has Class-AB operation, and comprises complementary transistor devices.

The fifth and seventh pairs of transistors (or [$M_{3P,A}$ 612, $M_{3N,A}$ 614, $M_{4P,A}$ 616, $M_{4N,A}$ 618]), can be of a same type, e.g., a first type.

The sixth pair of transistors (or [$M_{3P,B}$ 620, $M_{3N,B}$ 622]), can be of a same type, e.g., a second type, and may be complementary to the fifth pair of transistors (or [$M_{3P,A}$ 612, $M_{3N,A}$ 614]).

The eighth pair of transistors (or [$M_{4P,B}$ 624, $M_{4N,B}$ 626]), can be of a same type, e.g., the second type, and may be are complementary to the seventh pair of transistors (or [$M_{4P,A}$ 616, $M_{4N,A}$ 618]).

Transistor devices [$M_{3P,A}$ 612, $M_{3N,A}$ 614, $M_{4P,A}$ 616, $M_{4N,A}$ 618] can be n-channel transistor devices, and transistor devices [$M_{3P,B}$ 620, $M_{3N,B}$ 622, $M_{4P,B}$ 624, $M_{4N,B}$ 626] can be p-channel transistor devices, complementary to the n-channel transistor devices.

Optionally, AC coupling capacitors can be included at the gates of the transistor devices in buffer stage 604. AC coupling capacitors can be included between the output and the further output and respective gates of the transistor devices in buffer stage 604.

The output, [$O_{1P}$, $O_{1N}$], is coupled to the gates of the fifth pair of transistors, [$M_{3P,A}$ 612, $M_{3N,A}$ 614] via [$C_{C2}$ 652, $C_{C2}$ 654].

$M_{3P,A}$ 612 receives, at the gate of $M_{3P,A}$ 612, an output signal of the input stage 602 from $O_{1P}$, via AC coupling capacitor $C_{C2}$ 652.

$M_{3N,A}$ 614 receives, at the gate of $M_{3N,A}$ 614, an output signal of the input stage 602 from $O_{IN}$, via AC coupling capacitor $C_{C2}$ 654.

The output, [$O_{1P}$, $O_{1N}$], is coupled to the gates of the seventh pair of transistors, [$M_{4P,A}$ 616 and $M_{4N,A}$ 618] via [$C_{C3}$ 656, $C_{C3}$ 658].

$M_{4P,A}$ 616 receives, at the gate of $M_{4P,A}$ 616, an output signal of the input stage 602 from $O_{IP}$, via AC coupling capacitor $C_{C3}$ 656.

$M_{4N,A}$ 618 receives, at the gate of $M_{4N,A}$ 618, an output signal of the input stage 602 from $O_{IN}$, via AC coupling capacitor $C_{C3}$ 658.

The further output, [$O_{2P}$, $O_{2N}$], is coupled to the gates of the sixth pair of transistors, [$M_{3P,B}$ 620, $M_{3N,B}$ 622] via [$C_{C2}$ 662, $C_{C2}$ 664].

$M_{3P,B}$ 620 receives, at the gate of $M_{3P,B}$ 620, an output signal of the input stage 602 from the third one of the output, $O_{2P}$, via AC coupling capacitor $C_{C2}$ 662.

$M_{3N,B}$ 622 receives, at the gate of $M_{3N,B}$ 622, an output signal of the input stage 602 from the fourth one of the output, $O_{2N}$, via AC coupling capacitor $C_{C2}$ 664.

The further output, [$O_{2P}$, $O_{2N}$], is coupled to the gates of the eighth pair of transistors, [$M_{4P,B}$ 624, $M_{4N,B}$ 626] via [$C_{C3}$ 666, $C_{C3}$ 668].

$M_{4P,B}$ 624 receives, at the gate of $M_{4P,B}$ 624, a further output signal of the input stage 602 from $O_{2P}$, via AC coupling capacitor $C_{C3}$ 666.

$M_{4N,B}$ 626 receives, at the gate of $M_{4N,B}$ 626, the further output signal of the input stage 602 from $O_{2N}$, via AC coupling capacitor $C_{C3}$ 668.

Transistor devices in buffer stage 604, specifically, gates of transistor devices, are biased with biasing voltages: biasing voltage $V_{CD1}$, biasing voltage $V_{CD2}$, biasing voltage $V_{CD3}$, and biasing voltage $V_{CD4}$. Optionally, biasing resistor (e.g., $R_{B2}$ and $R_{B3}$) is provided at the gate of a transistor device (e.g., the common-drain transistor devices). A given biasing voltage can be generated from a bandgap generator, or a dedicated biasing circuit (e.g., a common-mode feedback circuit). Common-mode feedback circuits can be implemented to sense the output common-mode voltage of buffer stage 604 and generate a biasing voltage based on the sensed output common-mode voltage and a target output common-mode voltage.

Biasing resistors, shown as $R_{B2}$, are provided at the gates of the fifth pair of transistors, [$M_{3P,A}$ 612, $M_{3N,A}$ 614].

Gate of $M_{3P,A}$ 612 is biased by biasing voltage $V_{CD1}$, optionally through biasing resistor $R_{B2}$.

Gate of $M_{3N,A}$ 614 is biased by biasing voltage $V_{CD1}$, optionally through biasing resistor $R_{B2}$.

Biasing resistors, shown as $R_{B2}$, are provided at the gates of the sixth pair of transistors, [$M_{3P,B}$ 620, $M_{3N,B}$ 622].

Gate of $M_{3P,B}$ 620 is biased by biasing voltage $V_{CD3}$, optionally through biasing resistor $R_{B2}$.

Gate of $M_{3N,B}$ 622 is biased by biasing voltage $V_{CD3}$, optionally through biasing resistor $R_{B2}$.

Biasing resistors, shown as $R_{B3}$, are provided at the gates of the seventh pair of transistors, [$M_{4P,A}$ 616, $M_{4N,A}$ 618].

Gate of $M_{4P,A}$ 616 is biased by biasing voltage $V_{CD2}$, optionally through biasing resistor $R_{B3}$.

Gate of $M_{4N,A}$ 618 is biased by biasing voltage $V_{CD2}$, optionally through biasing resistor $R_{B3}$.

Biasing resistors, shown as RB3, are provided at the gates of the eight pair of transistors, [$M_{4P,B}$ 624, $M_{4N,B}$ 626].

Gate of $M_{4P,B}$ 624 is biased by biasing voltage $V_{CD4}$, optionally through biasing resistor $R_{B3}$.

Gate of $M_{4N,B}$ 626 is biased by biasing voltage $V_{CD4}$, optionally through biasing resistor $R_{B3}$.

Advantageously, the buffer stage 604, along with the AC coupling capacitors and biasing resistors, can be used with input stage 602 to bring additional technical effects to the receiver signal chain. The dominant input capacitance of the buffer stage 604 is a partially bootstrapped gate-to-source capacitance of the common-drain transistor devices due to the cascoding of the seventh and eighth pairs of transistors. The input capacitance could be about an order of magnitude smaller than the ADC sampling capacitor which follows the buffer stage 604. Therefore the buffer stage 604 can reduce the load to the input stage 602. Additionally, the buffer stage 604 has a relatively smaller output resistance $$\left(\sim \frac{1}{G_{m3,A} + G_{m3,B}}\right),$$

where $G_{m3,A}$ is the transconductance of [$M_{3P,A}$ 612, $M_{3N,A}$ 614], and $G_{m3,A}$ is the transconductance of [$M_{3P,B}$ 620, $M_{3N,B}$ 622]) than the input stage 602. The addition of the buffer stage 604 can also provide further isolation between the switched ADC load and the circuitry preceding the input stage 602, further simplifying the interfacing between the preceding circuitry and the ADC.

Method for Buffer or Amplifying an Input

Figure 7:
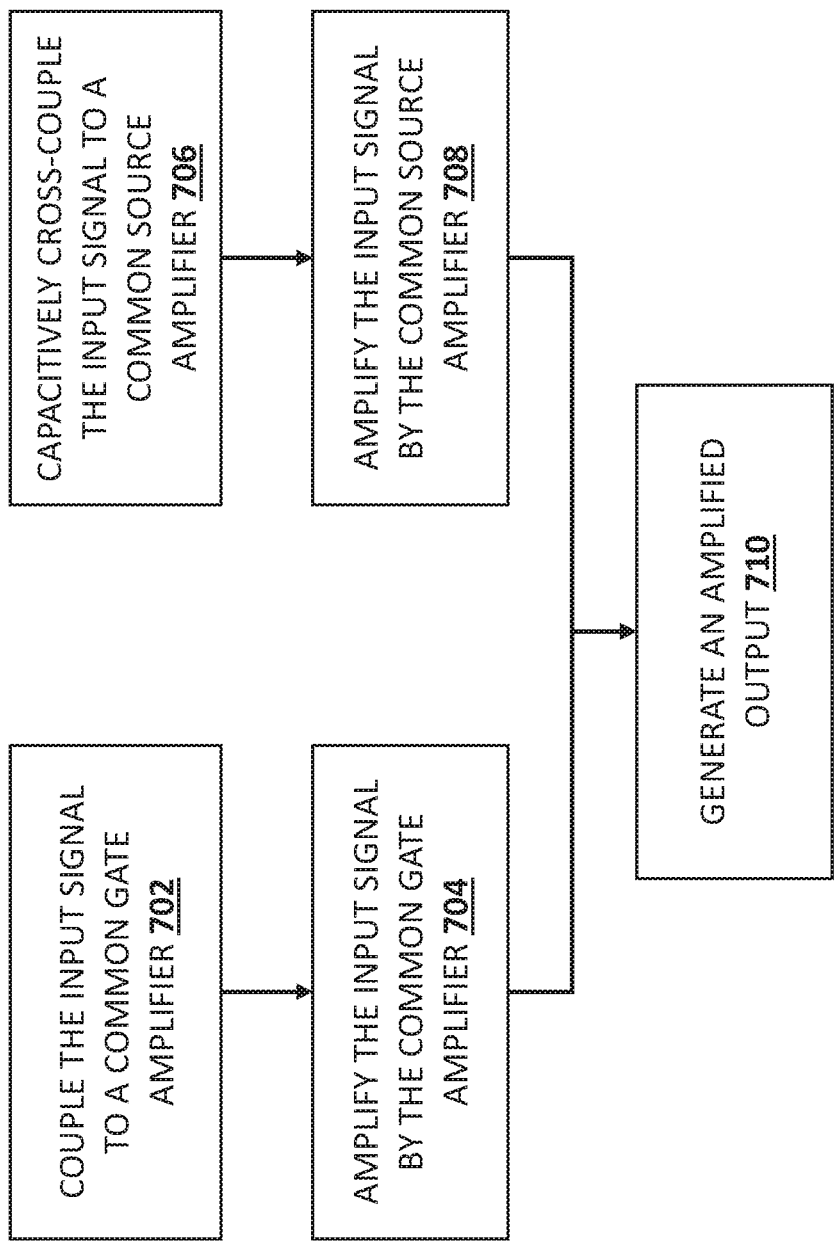
FIG. 7 shows a flow diagram illustrating a method for buffering or amplifying an input, according to some embodiments of the disclosure.

FIG. 7 shows a flow diagram illustrating a method for buffering or amplifying an input, according to some embodiments of the disclosure.

In 702, the input signal (e.g., input signal on [$V_{1P}$, $V_{1N}$]) is provided or coupled to a common-gate amplifier. The common-gate amplifier can correspond to transistors [$M_{1P,A}$, $M_{1N,A}$, and $M_{1P,B}$, $M_{1N,B}$] in the FIGURES.

In 706, the input signal is capacitively cross-coupled to a common-source amplifier. The common-source amplifier can correspond to correspond to transistors [$M_{2P,A}$, $M_{2N,A}$, and $M_{2P,B}$, $M_{2N,B}$] in the FIGURES. The common-gate amplifier is cascoded by the common-source amplifier.

In 704, the common-gate amplifier amplifies the input signal.

In 708, in parallel with the common-gate amplifier, the common-source amplifier amplifies the input signal.

In 710, the common-gate amplifier and the common-source amplifier generates an amplified output (e.g., $O_{1P}$, $O_{1N}$, $O_{2P}$, $O_{2N}$). For instance, the current generated by the common-gate amplifier and the current generated by the common-source amplifier can be summed to generate the amplified output.

In some embodiments, the amplified output is buffered, e.g., by a buffer such as the one shown in FIG. 6.

In some embodiments, the amplified output is capacitively coupled to a first common-drain buffer. The first common-drain buffer can correspond to transistors [$M_{3P,A}$ 612, $M_{3N,A}$ 614, $M_{3P,B}$ 620, $M_{3N,B}$ 622] in FIG. 6.

In some embodiments, the amplified output is capacitively coupled to a second common-drain buffer (in parallel with the first common-drain buffer). The second common-drain buffer can correspond to transistors [$M_{4P,A}$ 615, $M_{4N,A}$ 618, $M_{4P,B}$ 624, $M_{4N,B}$ 626] in FIG. 6. The first common-drain buffer is cascoded by the second common-drain buffer.

In some embodiments, the amplified output is buffered by, e.g., buffer stage 604 of FIG. 6.

EXAMPLES

Example 1 is an amplifier, comprising: a first one and a second one of an input (e.g., $V_{IP}$ and $V_{IN}$ respectively); a first one and a second one of an output (e.g., $O_{IP}$ and $O_{IN}$ respectively); a first transistor, such as $M_{1P,A}$ in a common-gate configuration wherein a source of the first transistor receives an input signal from the first one of the input; a second transistor, such as $M_{1N,A}$ in a common-gate configuration, wherein a source of the second transistor receives the input signal from the second one of the input; a third transistor, such as cascode $M_{2P,A}$ in a common-source configuration, wherein a gate of the third transistor receives the input signal from the second one of the input; and a fourth transistor, such as cascode $M_{2N,A}$ in a common-source configuration, wherein a gate of the fourth transistor receives the input signal from the first one of the input; wherein a drain of the first transistor is connected to a drain of the third transistor at the first one of the output (e.g., $O_{1P}$), and a drain of the second transistor is connected to a drain of the fourth transistor at a second one of the output (e.g., $O_{1N}$).

In Example 2, the amplifier of Example 1 can optionally include: a first capacitor (e.g., AC coupling capacitors $C_{C1}$) between the input and the gate of the third transistor.

In Example 3, the amplifier of Example 1 or 2 can optionally include: a first resistor (e.g., degeneration resistor $R_S$) at the source of the third transistor.

In Example 4, the amplifier of any one of Examples 1-3 can optionally include: a second resistor (e.g., termination resistor $R_T$) between the input and the source of the first transistor.

In Example 5, the amplifier of any one of Examples 1-4 can optionally include: a third resistor (e.g., load resistor $R_D$) between the first one and the second one of the output.

In Example 6, the amplifier of any one of Examples 1-5 can optionally include: a fourth resistor (e.g., biasing resistor $R_{B1}$) at the gate of the third transistor.

In Example 7, the amplifier of any one of Examples 1-6 can optionally include: the first and second transistors being of a first type, e.g., $M_{1P,A}$ and $M_{1N,A}$ are n-type devices, and the third and fourth transistors being of a second type complementary to the first type, e.g., $M_{2P,A}$ and $M_{2N,A}$ are p-type devices.

In Example 8, the amplifier of any one of Examples 1-7 can optionally include: a third one and a fourth one of the output, e.g., $O_{2P}$ and $O_{2N}$ respectively; a fifth transistor, such as $M_{1P,B}$ in common-gate configuration, wherein a source of the fifth transistor receives an input signal from the first one of the input; a sixth transistor, such as $M_{1N,B}$ in a common-gate configuration, wherein a source of the sixth transistor receives the input signal from the second one of the input; a seventh transistor, such as cascode $M_{2P,B}$ in a common-source configuration, wherein a gate of the seventh transistor receives the input signal from the second one of the input; and an eighth transistor, such as cascode $M_{2N,B}$ in a common-source configuration, wherein a gate of the eighth transistor receives the input signal from the first one of the input; wherein a drain of the fifth transistor is connected to a drain of the seventh transistor at the third one of the output (e.g., $O_{2P}$), and a drain of the sixth transistor is connected to a drain of the eighth transistor at a fourth one of the output (e.g., $O_{2N}$).

In Example 9, the amplifier of Example 8 can optionally include the seventh and eighth transistors being of a first type, e.g., $M_{2P,B}$ and $M_{2N,B}$ are n-type devices, and the fifth and sixth transistors being of a second type complementary to the first type, e.g., $M_{1P,B}$ and $M_{1N,B}$ are p-type devices.

In Example 10, the amplifier of any one of Examples 1-9 can optionally include: an output buffer to buffer first one and a second one of the output.

In Example 11, the amplifier of any one of Examples 1-10 can optionally include: a first one and a second one of a buffered output (e.g., $V_{OP}$, and $V_{ON}$ respectively); a ninth transistor, such as $M_{3P,A}$ 612 in a common-drain configuration, wherein a gate of the ninth transistor receives an output signal from the first one of the output, and a source of the ninth transistor is at the first one of the buffered output; and a tenth transistor, such as $M_{3N,A}$ 614 in a common-drain configuration, wherein a gate of the tenth transistor receives the output signal from the second one of the output, and a source of the tenth transistor is at the second one of the buffered output.

In Example 12, the amplifier of Example 11 can optionally include: an eleventh transistor, such as cascode $M_{4P,A}$ 616 in a common-drain configuration, wherein a gate of the eleventh transistor receives the output signal from the first one of the output, and a source of the eleventh transistor is connected to a drain of the ninth transistor; and a twelfth transistor, such as cascode $M_{4N,A}$ 618, in a common-drain configuration, wherein a gate of the twelfth transistor receives the output signal from the second one of the output, and a source of the twelfth transistor is connected to a drain of the tenth transistor.

In Example 13, the amplifier of Example 12 can optionally include: the ninth, the tenth, the eleventh, and the twelfth transistors being of a same type, e.g., $M_{3P,A}$ 612, $M_{3N,A}$ 614, $M_{4P,A}$ 616, $M_{4N,A}$ 618 being n-type devices.

In Example 14, the amplifier of any one of Examples 11-13 can optionally include: a second capacitor (e.g., AC coupling capacitor $C_{C2}$) between the first one of the output and the gate of the ninth transistor.

In Example 15, the amplifier of any one of Examples 11-14 can optionally include: a fifth resistor (e.g., biasing resistor $R_{B2}$) at the gate of the ninth transistor.

In Example 16, the amplifier of any one of Examples 12-15 can optionally include: a third capacitor (e.g., AC coupling capacitor $C_{C3}$) between the first one of the output and the gate of the eleventh transistor.

In Example 17, the amplifier of any one of Examples 12-16 can optionally include: a fifth resistor (e.g., biasing resistor $R_{B3}$) at the gate of the eleventh transistor.

In Example 18, the amplifier of any one of Examples 11-17 can optionally include: a thirteenth transistor, such as $M_{3P,B}$ 620 in a common-drain configuration, wherein a gate of the thirteenth transistor receives an output signal from the third one of the output, and a source of the thirteenth transistor is at the first one of the buffered output; and a fourteenth transistor, such as $M_{3N,B}$ 622 in a common-drain configuration, wherein a gate of the fourteenth transistor receives the output signal from the fourth one of the output, and a source of the fourteenth transistor is at the second one of the buffered output.

In Example 19, the amplifier of Example 18 can optionally include: the thirteenth, and the fourteenth transistors being of a same type, and are complementary to the ninth and the tenth transistors, e.g., $M_{3P,B}$ 620 and $M_{3N,B}$ 622 being p-type devices.

In Example 20, the amplifier of Example 18 or 19 can optionally include: a fifteenth transistor, such as cascode $M_{4P,B}$ 624 in a common-drain configuration, wherein a gate of the fifteenth transistor receives a further output signal from the third one of the output, and a source of the ninth transistor is connected to a drain of the thirteenth transistor; and a sixteenth transistor, such as cascode $M_{4N,B}$ 626 in a common-drain configuration, wherein a gate of the sixteenth transistor receives the further output signal from the fourth one of the output, and a source of the twelfth transistor is connected to a drain of the fourteenth transistor.

In Example 21, the amplifier of Example 20 can optionally include: the fifteenth, and the sixteenth transistors being of a same type, and are complementary to the eleventh and the twelfth transistors, e.g., $M_{4P,B}$ 624 and $M_{4N,B}$ 626 being p-type devices.

Example 22 is an amplifier, comprising: a first pair of transistors (e.g., [$M_{1P,A}$, $M_{1N,A}$]) to receive an input (e.g., [$V_{1P}$, $V_{1N}$]) at sources of the first pair of transistors and generate an output (e.g., [$V_{1P}$, $V_{1N}$]) at drains of the first pair of transistors; a second pair of transistors (e.g., [$M_{2P,A}$, $M_{2N,A}$]) in cascode configuration with the first pair of transistors, to receive the input at gates of the second pair of transistors; a third pair of transistors (e.g., [$M_{1P,B}$, $M_{1N,B}$]) complementary to the first pair of transistors, to receive an input at sources of the first pair of transistors and generate a further output (e.g., [$O_{2P}$, $O_{2N}$]) at drains of the third pair of transistors; and a fourth pair of transistors (e.g., [$M_{2P,B}$, $M_{2N,B}$]) complementary to the second pair of transistors and in cascode configuration with the third pair of transistors, to receive the input at gates of the fourth pair of transistors.

In Example 23, the amplifier of Example 22 can optionally include: the input being cross-coupled to the gates of the second pair of transistors, e.g., $V_{1P}$ is coupled to gate of $M_{2N,A}$, and $V_{1N}$ is coupled to gate of $M_{2P,A}$.

In Example 24, the amplifier of Example 22 or 23 can optionally include: the input being cross-coupled to the gates of the fourth pair of transistors, e.g., $V_{1P}$ is coupled to gate of $M_{2N,B}$, and $V_{1N}$ is coupled to gate of $M_{2P}$,B.

In Example 25, the amplifier of any one of Examples 22-24 can optionally include: the input being cross-coupled to the gates of the second pair of transistors via a first pair of capacitors, e.g., AC coupling capacitors $C_{C1}$.

In Example 26, the amplifier of any one of Examples 22-25 can optionally include: the input being cross-coupled to the gates of the fourth pair of transistors via a second pair of capacitors, e.g., AC coupling capacitors $C_{C1}$.

In Example 27, the amplifier of any one of Examples 22-26 can optionally include: termination resistors, e.g., $R_1$, at the input.

In Example 28, the amplifier of any one of Examples 22-27 can optionally include: one or more first load resistors, e.g., $R_D$, at the output.

In Example 29, the amplifier of any one of Examples 22-28 can optionally include: one or more second load resistors, e.g., $R_D$, at the further output.

In Example 30, the amplifier of any one of Examples 22-29 can optionally include: first degeneration resistors, e.g., $R_S$, at sources of the second pair of transistors.

In Example 31, the amplifier of any one of Examples 22-30 can optionally include: second degeneration resistors, e.g., $R_S$, at sources of the fourth pair of transistors.

In Example 32, the amplifier of any one of Examples 22-31 can optionally include: first biasing resistors, e.g., $R_{B1}$, at gates of the second pair of transistors.

In Example 33, the amplifier of any one of Examples 22-32 can optionally include: second biasing resistors, e.g., $R_{B1}$ at gates of the fourth pair of transistors.

In Example 34, the amplifier of any one of Examples 22-33 can optionally include: an output buffer to buffer the output and the further output.

In Example 35, the amplifier of any one of Examples 22-33 can optionally include: a fifth pair of transistors, such as [$M_{3P,A}$ 612, $M_{3N,A}$ 614], to receive the output at gates of the fifth pair of transistors and to generate a buffered output (e.g., [$V_{Op}$, $V_{ON}$]) at sources of the fifth pair of transistors; and a sixth pair of transistors, such as [$M_{3P,B}$ 620, $M_{3N,B}$ 622], complementary to the fifth pair of transistors, to receive the further output at gates of the sixth pair of transistors and to generate the buffered output at sources of the sixth pair of transistors.

In Example 36, the amplifier of Example 35 can optionally include: a seventh pair of transistors, such as [$M_{4P,A}$ 616, $M_{4N,A}$ 618], in cascode configuration with the fifth pair of transistors, to receive the output at gates of the seventh pair of transistors; and an eighth pair of transistors, such as [$M_{4P,B}$ 624, $M_{4N,B}$ 626], complementary to the seventh pair of transistors and in cascode configuration with the sixth pair of transistors, to receive the further output at gates of the eighth pair of transistors.

In Example 37, the amplifier of Example 35 or 36 can optionally include: the output being coupled to the gates of the fifth pair of transistors via a third pair of capacitors, e.g., [$C_{C2}$ 652, $C_{C2}$ 654].

In Example 38, the amplifier of any one of Examples 36-37 can optionally include: the output being coupled to the gates of the seventh pair of transistors via a fourth pair of capacitors, e.g., [$C_{C3}$ 656, $C_{C3}$ 658].

In Example 39, the amplifier of any one of Examples 35-38 can optionally include: the further output being coupled to the gates of the sixth pair of transistors via a fifth pair of capacitors, e.g., [$C_{C2}$ 662, $C_{C2}$ 664].

In Example 40, the amplifier of any one of Examples 36-39 can optionally include: the further output being coupled to the gates of the eighth pair of transistors via a sixth pair of capacitors, e.g., [$C_{C3}$ 666, $C_{C3}$ 668].

In Example 41, the amplifier of any one of Examples 35-40 can optionally include: third biasing resistors, e.g., $R_{B2}$ at the gates of the fifth pair of transistors.

In Example 42, the amplifier of any one of Examples 35-41 can optionally include: fourth biasing resistors, e.g., $R_{B2}$ at the gates of the sixth pair of transistors.

In Example 43, the amplifier of any one of Examples 36-42 can optionally include: fifth biasing resistors, e.g., $R_{B3}$, at the gates of the seventh pair of transistors.

In Example 44, the amplifier of any one of Examples 36-43 can optionally include: sixth biasing resistors, e.g., $R_{B3}$, at the gates of the eighth pair of transistors.

Example 45 is a method to amplify an input signal, comprising: coupling the input signal to a common-gate amplifier, e.g., [$M_{1P,A}$, $M_{1N,A}$]; capacitively cross-coupling the input signal to a common-source amplifier; wherein the common-gate amplifier is cascoded by the common-source amplifier, e.g., [$M_{2P,A}$, $M_{2N,A}$]; amplifying the input signal by the common-gate amplifier; amplifying the input signal by the common-source amplifier in parallel with the common-gate amplifier; and generating an amplified output by the common-gate amplifier and the common-source amplifier.

In Example 46, the method of Example 45, further comprising: buffering the amplified output (e.g., by output stage 604).

In Example 47, the method of Example 45 or 46 can optionally include: capacitively coupling the amplified output to a first common-drain buffer, e.g., [$M_{3P,A}$ 612, $M_{3N,A}$ 614], or [$M_{3P,B}$ 620, $M_{3N,B}$ 622].

In Example 48, the method of any one of Examples 45-47 can optionally include: capacitively coupling the amplified output to a second common-drain buffer, e.g., [$M_{4P,A}$ 616, $M_{4N,A}$ 618] or [$M_{4P,B}$ 624, $M_{4N,B}$ 626], wherein the first common-drain buffer is cascoded by the second common-drain buffer.

Example A is an apparatus comprising means for performing any one of the methods described herein.

Other Implementation Notes, Variations, and Applications

It is also imperative to note that various devices described herein have only been offered for purposes of example and teaching only. Such information may be varied considerably without departing from the spirit of the present disclosure, or the scope of the appended claims. The various embodiments apply only to one non-limiting example and, accordingly, they should be construed as such. In the foregoing description, example embodiments have been described with reference to particular device arrangements. Various modifications and changes may be made to such embodiments without departing from the scope of the appended claims. The description and drawings are, accordingly, to be regarded in an illustrative rather than in a restrictive sense.

The amplifier architectures describe herein are particularly suitable for high speed, wide bandwidth, high precision applications where the performance is critical. Applications which can greatly benefit from the architecture include: instrumentation, testing, spectral analyzers, military purposes, radar, wired or wireless communications, mobile telephones (especially because standards continue to push for higher speed communications), and base stations. These products are employed in wired and wireless communications, instrumentation, radar, electronic warfare, and other applications.

Note that with the numerous examples provided herein, interaction may be described in terms of two, three, four, or more electrical devices or components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions herein, such as the functions of circuits shown in FIGS. 4-6 and the method shown in FIG. 7, illustrate only some of the possible functions that may be carried out by, implemented by, executed by, or within, the systems illustrated in FIGS. 4-6. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. An amplifier, comprising:
   a first one and a second one of an input;
   a first one and a second one of an output;

a first transistor, wherein a source of the first transistor receives an input signal from the first one of the input;

a second transistor, wherein a source of the second transistor receives the input signal from the second one of the input;

a third transistor, wherein a gate of the third transistor receives the input signal from the second one of the input; and a fourth transistor, wherein a gate of the fourth transistor receives the input signal from the first one of the input;

wherein a drain of the first transistor is connected to a drain of the third transistor at the first one of the output, and a drain of the second transistor is connected to a drain of the fourth transistor at a second one of the output.

2. The amplifier of claim 1, further comprising:
a first capacitor between the input and the gate of the third transistor.

3. The amplifier of claim 1, further comprising:
a first resistor at the source of the third transistor.

4. The amplifier of claim 1, further comprising:
a second resistor between the input and the source of the first transistor.

5. The amplifier of claim 1, further comprising:
a third resistor between the first one and the second one of the output.

6. The amplifier of claim 1, further comprising:
a fourth resistor at the gate of the third transistor.

7. The amplifier of claim 1, wherein:
the first and second transistors are of a first type; and
the third and fourth transistors are of a second type complementary to the first type.

8. The amplifier of claim 1, further comprising:
a third one and a fourth one of the output;
a fifth transistor, wherein a source of the fifth transistor receives an input signal from the first one of the input;
a sixth transistor, wherein a source of the sixth transistor receives the input signal from the second one of the input;
a seventh transistor, wherein a gate of the seventh transistor receives the input signal from the second one of the input; and
an eighth transistor, wherein a gate of the eighth transistor receives the input signal from the first one of the input;
wherein a drain of the fifth transistor is connected to a drain of the seventh transistor at a third one of the output, and a drain of the sixth transistor is connected to a drain of the eighth transistor at a fourth one of the output.

9. The amplifier of claim 8, wherein:
the seventh and eighth transistors are of a first type; and
the fifth and sixth transistors are of a second type complementary to the first type.

10. The amplifier of claim 1, further comprising:
an output buffer to buffer first one and a second one of the output.

11. The amplifier of claim 1, further comprising:
a first one and a second one of a buffered output;
a ninth transistor, wherein a gate of the ninth transistor receives an output signal from the first one of the output, and a source of the ninth transistor is at a first one of the buffered output; and
a tenth transistor, wherein a gate of the tenth transistor receives the output signal from the second one of the output, and a source of the tenth transistor is at a second one of the buffered output.

12. The amplifier of claim 11, further comprising:
an eleventh transistor, wherein a gate of the eleventh transistor receives the output signal from the first one of the output, and a source of the eleventh transistor is connected to a drain of the ninth transistor; and
a twelfth transistor, wherein a gate of the twelfth transistor receives the output signal from the second one of the output, and a source of the twelfth transistor is connected to a drain of the tenth transistor.

13. The amplifier of claim 11, further comprising:
a second capacitor between the first one of the output and the gate of the ninth transistor.

14. The amplifier of claim 11, further comprising:
a fifth resistor at the gate of the ninth transistor.

15. The amplifier of claim 12, further comprising:
a third capacitor between the first one of the output and the gate of the eleventh transistor.

16. The amplifier of claim 12, further comprising:
a fifth resistor at the gate of the eleventh transistor.

17. The amplifier of claim 12, further comprising:
a thirteenth transistor, wherein a gate of the thirteenth transistor receives an output signal from a third one of the output, and a source of the thirteenth transistor is at the first one of the buffered output; and
a fourteenth transistor, wherein a gate of the fourteenth transistor receives the output signal from a fourth one of the output, and a source of the fourteenth transistor is at the second one of the buffered output.

18. The amplifier of claim 17, further comprising:
a fifteenth transistor, wherein a gate of the fifteenth transistor receives a further output signal from the third one of the output, and a source of the ninth transistor is connected to a drain of the thirteenth transistor; and
a sixteenth transistor, wherein a gate of the sixteenth transistor receives the further output signal from the fourth one of the output, and a source of the twelfth transistor is connected to a drain of the fourteenth transistor.

19. An amplifier, comprising:
a first pair of transistors, to receive an input at sources of the first pair of transistors and generate an output at drains of the first pair of transistors;
a second pair of transistors, in cascode configuration with the first pair of transistors, to receive the input at gates of the second pair of transistors;
a third pair of transistors, complementary to the first pair of transistors, to receive an input at sources of the first pair of transistors and generate a further output at drains of the third pair of transistors; and
a fourth pair of transistors, complementary to the second pair of transistors and in cascode configuration with the third pair of transistors, to receive the input at gates of the fourth pair of transistors.

20. A method to amplify an input signal, comprising:
coupling the input signal to a common-gate amplifier;
capacitively cross-coupling the input signal to a common-source amplifier; wherein the common-gate amplifier is cascoded by the common-source amplifier;
amplifying the input signal by the common-gate amplifier;
amplifying the input signal by the common-source amplifier in parallel with the common-gate amplifier; and
generating an amplified output by the common-gate amplifier and the common-source amplifier.

21. The method of claim 20, further comprising:
buffering the amplified output.

22. The method of claim 20, further comprising:
capacitively coupling the amplified output to a first common-drain buffer.

23. The method of claim 22, further comprising:
capacitively coupling the amplified output to a second common-drain buffer, wherein the first common-drain buffer is cascoded by the second common-drain buffer.

24. The amplifier of claim 19, wherein:
the input is cross-coupled to the gates of the second pair of transistors; and
the input is cross-coupled to the gates of the fourth pair of transistors.

25. The amplifier of claim 19, wherein:
the input is cross-coupled to the gates of the second pair of transistors via a first pair of capacitors; and
the input is cross-coupled to the gates of the fourth pair of transistors via a second pair of capacitors.

26. The amplifier of claim 19, further comprising:
termination resistors at the input.

27. The amplifier of claim 19, further comprising:
one or more first load resistors at the output; and
one or more second load resistors at the further output.

28. The amplifier of claim 19, further comprising:
first degeneration resistors at sources of the second pair of transistors; and
second degeneration resistors at sources of the fourth pair of transistors.

29. The amplifier of claim 19, further comprising:
first biasing resistors at gates of the second pair of transistors; and
second biasing resistors at gates of the fourth pair of transistors.

30. The amplifier of claim 19, further comprising:
an output buffer to buffer the output and the further output.

31. The amplifier of claim 12, wherein the ninth, the tenth, the eleventh, and the twelfth transistors are of a same type.

32. The amplifier of claim 17, wherein the thirteenth, and the fourteenth transistors are of a same type, and are complementary to the ninth and the tenth transistors.

33. The amplifier of claim 18, wherein the fifteenth, and the sixteenth transistors are of a same type, and are complementary to the eleventh and the twelfth transistors.

* * * * *